(12) United States Patent
Kramer et al.

(10) Patent No.: US 11,698,997 B2
(45) Date of Patent: Jul. 11, 2023

(54) MODEL MATURITY STATE EVALUATION SYSTEM

(71) Applicant: The Boeing Company, Chicago, IL (US)

(72) Inventors: Nicholas J. Kramer, Seattle, WA (US); Scott Christopher Haase, Redmond, WA (US); Steven Douglas Swaine, Everett, WA (US); Jeffrey Keith Sipes, Lake Tapps, WA (US); Angayarkanni Saravana, Bothell, WA (US); Samuel James Tutko, Covington, WA (US); Terri Wen-Ching Chan, Seattle, WA (US); Keith Harrell, Snohomish, WA (US); Steven Charles Holt, Woodinville, WA (US); Walter S. Wall, Seattle, WA (US); Neil Ebarle, Summerville, SC (US); Shannon Fowler, Puyallup, WA (US)

(73) Assignee: The Boeing Comapny, Arlington, VA (US)

( * ) Notice: Subject to any disclaimer, the term of this patent is extended or adjusted under 35 U.S.C. 154(b) by 293 days.

(21) Appl. No.: 16/733,009

(22) Filed: Jan. 2, 2020

(65) Prior Publication Data

US 2021/0209260 A1   Jul. 8, 2021

(51) Int. Cl.
*G06F 30/10* (2020.01)
*G06F 16/9035* (2019.01)
*G06F 30/20* (2020.01)

(52) U.S. Cl.
CPC .......... *G06F 30/10* (2020.01); *G06F 16/9035* (2019.01); *G06F 30/20* (2020.01)

(58) Field of Classification Search
CPC ............ G05B 23/0232; G05B 23/0235; G05B 23/0283; G05B 23/0286; G06F 30/00; G06F 30/15; G06F 30/20; G06F 30/02; G06F 30/33; G06F 30/3308; Y10S 706/919; Y10S 706/92
USPC .............................................. 703/1
See application file for complete search history.

(56) References Cited

U.S. PATENT DOCUMENTS

| | | | | |
|---|---|---|---|---|
| 5,208,765 A | * | 5/1993 | Turnbull ............ | G06Q 10/0875 705/29 |
| 5,767,848 A | * | 6/1998 | Matsuzaki ............ | G06Q 10/10 715/752 |
| 5,864,480 A | * | 1/1999 | Ladd ...................... | G06Q 99/00 700/83 |
| 6,138,104 A | * | 10/2000 | Marchak ........ | G06Q 10/063114 705/7.17 |
| 6,327,551 B1 | * | 12/2001 | Peterson ................... | G06F 8/10 700/98 |

(Continued)

*Primary Examiner* — Brian S Cook
(74) *Attorney, Agent, or Firm* — Yee & Associates, P.C.

(57) ABSTRACT

A method, apparatus, system, and computer program product for evaluating a maturity of a model for a product. A selected maturity state is determined by a computer system for the model for evaluation. A determination is made by the computer system as to whether the model meets a set of criteria for the selected maturity state and a confidence level for the selected maturity state. A model action is performed by the computer system using the model when the model meets the set of criteria for the selected maturity state and the confidence level for the selected maturity state.

48 Claims, 14 Drawing Sheets

(56) References Cited

U.S. PATENT DOCUMENTS

| | | | |
|---|---|---|---|
| 6,405,364 B1 * | 6/2002 | Bowman-Amuah | G06Q 10/06 717/124 |
| 6,493,693 B1 * | 12/2002 | Hill | G06Q 10/04 706/45 |
| 7,788,070 B2 * | 8/2010 | Grichnik | G06F 30/20 703/1 |
| 7,899,756 B2 * | 3/2011 | Rizzolo | G06Q 10/103 707/804 |
| 8,160,920 B2 * | 4/2012 | Gerke | G06Q 10/0639 705/7.36 |
| 8,219,435 B2 * | 7/2012 | Frank | G06Q 10/06 705/7.15 |
| 8,510,140 B2 * | 8/2013 | Bangs | G06Q 10/101 705/7.11 |
| 8,532,963 B2 | 9/2013 | Bhandari et al. | |
| 2004/0015377 A1 * | 1/2004 | Hostetler | G06F 8/77 705/7.11 |
| 2004/0044555 A1 * | 3/2004 | Bangs | G06Q 10/06393 705/7.12 |
| 2004/0098154 A1 * | 5/2004 | McCarthy | G06Q 10/06 700/97 |
| 2004/0098299 A1 * | 5/2004 | Ligon | G06Q 10/0639 705/7.29 |
| 2005/0125272 A1 * | 6/2005 | Hostetler | G06F 8/77 705/7.21 |
| 2006/0069540 A1 * | 3/2006 | Krutz | G06Q 10/06 703/22 |
| 2006/0229926 A1 * | 10/2006 | Homann | G06Q 10/0639 705/7.36 |
| 2008/0091492 A1 * | 4/2008 | Bowler | G06Q 10/06393 705/7.39 |
| 2008/0313110 A1 * | 12/2008 | Kreamer | G06Q 10/06 706/12 |
| 2012/0215574 A1 * | 8/2012 | Driessnack | G06Q 10/0639 705/7.12 |
| 2013/0030850 A1 * | 1/2013 | Marrelli | G06Q 10/00 705/7.11 |
| 2013/0304431 A1 * | 11/2013 | Kannegala | G06Q 10/00 703/2 |
| 2018/0365357 A1 * | 12/2018 | James | G06T 17/20 |
| 2020/0184119 A1 * | 6/2020 | Machalica | G06F 30/10 |

* cited by examiner

MODEL MATURITY STATE EVALUATION SYSTEM

BACKGROUND INFORMATION

1. Field

The present disclosure relates generally to an improved computer system and, in particular, to a method, apparatus, system, and computer program for evaluating a maturity state of models.

2. Background

Model-based engineering (MBE) is an approach to engineering that uses models as an integral part of a process for performing engineering tasks. With model-based engineering, one or more models for a product form an authoritative information source for activities performed on the product through a lifecycle of the product. With model-based engineering, various models of a product can be used to connect models, documents, artifacts, and engineering teams as a single source of information. This approach can reduce rework during product development and improve quality of a product.

An example of these models can be three-dimensional models of the physical design and can be used for performing engineering tasks such as requirements, analysis, design, implementation, verification, and other tasks with respect to a product. The models are information rich and include information such as dimensions, processes, materials, and other information needed to develop, design, manufacture, and maintain a product.

One challenge with the use of models is the level of completeness or development of a model. Some models may have a lower level of completeness in which the fidelity or detail of the model may be lower than another model for the product. For example, the level of detail in a model may not be sufficient for the model to be used to perform a desired analysis.

For example, if a need arises to understand how a component works in a product, a model of the component can be made and used in simulations or other analysis of the components. However, although this model is sufficient for understanding how the component works, the model may not have a level of development that enables the use of this model with other models for the product. Determining the ability to use this model with other models or for other purposes can be more time-consuming than desired as the number of models increases for a product. As a result, this model may only be used for a single-purpose with another model of the component being created that can be used as desired with other models in other purposes.

Therefore it would be desirable to have a method and apparatus that take into account at least some of the issues discussed above, as well as other possible issues. For example, it would be desirable to have a method and apparatus that overcome a technical problem with managing models for a product.

SUMMARY

An embodiment of the present disclosure provides a method for evaluating a maturity of a model for a product. A selected maturity state is determined by a computer system for the model for evaluation. A determination is made by the computer system as to whether the model meets a set of criteria for the selected maturity state and a confidence level for the selected maturity state. A model action is performed by the computer system using the model when the model meets the set of criteria for the selected maturity state and the confidence level for the selected maturity state.

Another embodiment of the present disclosure provides a method for evaluating a maturity of a model for a product. Potential maturity states are determined by the computer system for the model based on criteria for maturity states and confidence levels for the maturity states. A highest potential maturity state in the potential maturity states, in which the model meets a set of the criteria for the highest potential maturity state and a model confidence level for the model meets a confidence level for the highest potential maturity state, is determined by the computer system. The highest potential maturity state is a maturity state for the model. A model action is performed by the computer system for the product using the model based on the maturity state determined for the model.

Still another embodiment of the present disclosure provides a method for evaluating a maturity of models for a product. The models for the product are identified by a computer system for evaluation. Highest potential maturity states are identified by the computer system for the models using criteria and confidence levels, wherein the highest potential maturity states for the models are maturity states for models. A model action is performed by the computer system based on the maturity states for the models determined for the models.

Yet another embodiment of the present disclosure provides a product management system comprising a computer system and a product manager in the computer system. The product manager is configured to determine a selected maturity state for the model for evaluation. The product manager is configured to determine whether the model meets a set of criteria for the selected maturity state and a confidence level for the selected maturity state. The product manager is configured to perform a model action for the product using the model when the model meets the set of criteria and the confidence level.

Another embodiment of the present disclosure provides a product management system comprising a computer system and a product manager in the computer system. The product manager is configured to determine potential maturity states for the model based on criteria for maturity states and confidence levels for the maturity states. The product manager is configured to determine a highest potential maturity state in the potential maturity states in which the model meets a set of the criteria for the highest potential maturity state and a model confidence level for model that meets a confidence level for the highest potential maturity state, wherein the highest potential maturity state is a maturity state for the model. The product manager is configured to perform a model action for the product using the model based on the maturity state determined for the model.

Yet another embodiment of the present disclosure provides a product management system comprising a computer system and a product manager in the computer system. The product manager is configured to identify models for a product for evaluation. The product manager is configured to determine highest potential maturity states for the models using criteria and confidence levels, wherein the highest potential maturity states for the models are maturity states for models. The product manager is configured to perform a model action based on the maturity states for the models determined for the models.

A further embodiment of the present disclosure provides a computer program product for determining a maturity state of a model. The computer program product comprises a computer-readable storage media and a data structure, stored on the computer-readable storage media, comprising maturity states, criteria for the maturity states in which the criteria identifies model elements and requirements for the model elements needed for each maturity state in the maturity states, and confidence levels for the maturity states in which a confidence level for a maturity state is a level of confidence that the model can meet the criteria for the maturity state.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that different levels of development of a model may be evaluated to determine a model maturity for the model. The illustrative embodiments recognize and take into account that a determination of the maturity of a model can be made by human operators evaluating a large and complex list of model maturity criteria. The illustrative embodiments recognize and take into account that the time and expense of evaluating models for a model maturity using current techniques increases as the criteria for determining the maturity of the models increases. The illustrative embodiments recognize and take into account that one effect of this issue is that the determinations of the model maturity may be discouraged or limited. The illustrative embodiments recognize and take into account that this situation reduces the amount of information available to integration and management teams when developing a product.

Further, the illustrative embodiments recognize and take into account that different human operators evaluating the same model may generate different results as to whether criteria are met. The illustrative embodiments recognize and take into account that different conclusions of a model maturity can occur with large, complex products having long development cycles, in which it is likely that many different evaluators determine model maturity models for the product.

Thus, the illustrative embodiments provide a method, apparatus, and system for a structured determination of a model maturity. The illustrative embodiments can reduce the complexity and time associated with determining the model maturity. Further, the illustrative embodiments can improve consistency in model maturity determinations.

The illustrative embodiments provide a method, apparatus, system, and computer program product for evaluating a maturity of a model for a product. A selected maturity state for the model for evaluation can be identified. A determination can be made as to whether the model meets a set of criteria for the selected maturity state and a confidence level for the selected maturity state. A model action can be performed for the product using the model when the model meets the set of criteria for the selected maturity state and the confidence level for the selected maturity state.

Figure 1:
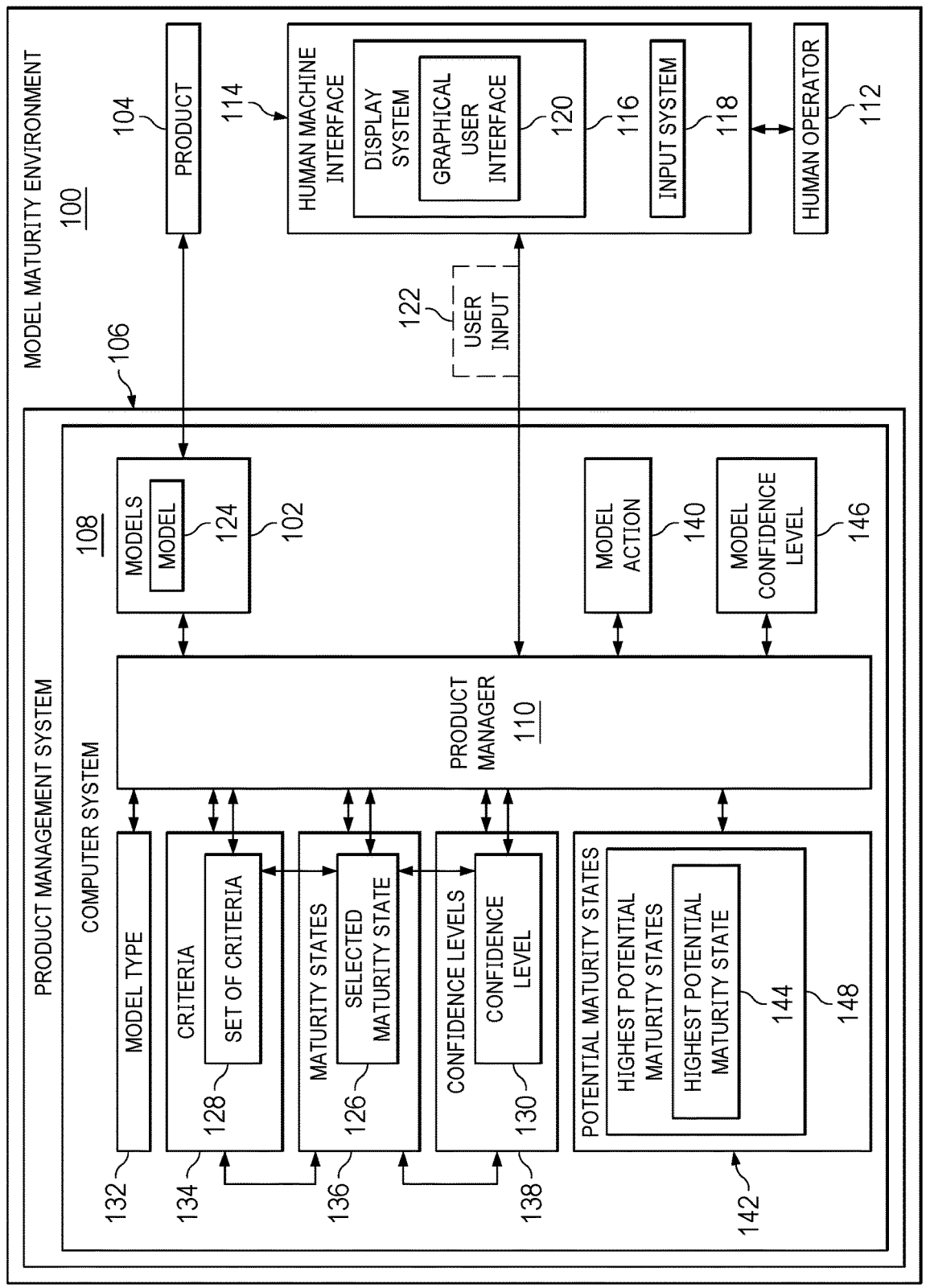
FIG. 1 is an illustration of a model maturity environment in accordance with an illustrative embodiment.

With reference now to figures and, in particular, with reference to FIG. 1, an illustration of a model maturity environment is depicted in accordance with an illustrative embodiment. Model maturity environment 100 is an environment in which models 102 can be managed for product 104.

In this illustrative example, models 102 are data in a form accessible by a data processing system such as a computer. In this illustrative example, models 102 can be two-dimensional or three-dimensional models. Models 102 are representations of physical objects but are not the actual physical objects. Models 102 can be designed to provide answers to questions such as describing or predicting characteristics or behavior of that object. Models 102 can also be used to manufacture parts or components for product 104. In this illustrative example, models 102 can be selected from at least one of a computer-aided design model, a computer-aided manufacturing model, a behavioral model, or some other suitable model that can be used to develop, manufacture, maintain, or provide services for product 104.

Product 104 can take a number of different forms. For example, product 104 can be selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, a maintenance system, a product service, and other suitable products.

In this illustrative example, product management system 106 can be used to manage models 102. This management can be used in a lifecycle of product 104. The management of models 102 can include performing operations with respect to models 102 selected from at least one of developing, storing, organizing, modifying, analyzing, and other suitable operations for models 102.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In this illustrative example, product management system 106 comprises computer system 108 and product manager 110 in computer system 108. Product manager 110 can be implemented in software, hardware, firmware, or a combination thereof. When software is used, the operations performed by product manager 110 can be implemented in program code configured to run on hardware, such as a processor unit. When firmware is used, the operations performed by product manager 110 can be implemented in program code and data and stored in persistent memory to run on a processor unit. When hardware is employed, the hardware can include circuits that operate to perform the operations in product manager 110.

In the illustrative examples, the hardware can take a form selected from at least one of a circuit system, an integrated circuit, an application specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field programmable logic array, a field programmable gate array, and other suitable hardware devices. Additionally, the processes can be implemented in organic components integrated with inorganic components and can be comprised entirely of organic components excluding a human being. For example, the processes can be implemented as circuits in organic semiconductors.

Computer system 108 is a physical hardware system and includes one or more data processing systems. When more than one data processing system is present in computer system 108, those data processing systems are in communication with each other using a communications medium. The communications medium can be a network. The data processing systems can be selected from at least one of a computer, a server computer, a tablet computer, or some other suitable data processing system.

In managing models 102 for product 104, human operator 112 can develop a set of models 102 through human machine interface (HMI) 114. As used herein, a "set of," when used with reference to items, means one or more items. For example, a "set of models 102" is one or more models 102.

In this illustrative example, human machine interface 114 enables human operator 112 to interact with product manager 110 in performing operations with respect to models 102 including developing, modifying, analyzing, viewing, and other operations with respect to model 102. As depicted, human machine interface 114 comprises display system 116 and input system 118.

Display system 116 is a physical hardware system and includes one or more display devices on which graphical user interface 120 can be displayed. The display devices can include at least one of a light emitting diode (LED) display, a liquid crystal display (LCD), an organic light emitting diode (OLED) display, a computer monitor, a projector, a flat panel display, a heads-up display (HUD), or some other suitable device that can output information for the visual presentation of information.

Human operator 112 is a person that can interact with graphical user interface 120 through user input 122 generated by input system 118 for computer system 108. Input system 118 is a physical hardware system and can be selected from at least one of a mouse, a keyboard, a trackball, a touchscreen, a stylus, a motion-sensing input device, a cyber glove, or some other suitable type of input device.

As depicted, product manager 110 in computer system 108 can operate to determine maturity states 136 for models 102. For example, human operator 112 can select model 124 in models 102 for determining selected maturity state 126 of model 124. Maturity states 136 can be used to determine how model 124 can be used with respect to design, manufacturing, or maintenance, or other phases of a product development plan for product 104.

Further, at least one of human operator 112 or product manager 110 can determine selected maturity state 126. In other words, human operator 112, product manager 110, or both can choose a maturity state that is of interest for model 124 in which the chosen maturity state is selected maturity state 126.

Product manager 110 can determine whether model 124 has selected maturity state 126. Further, product manager 110 can select a particular model maturity state to the maturity state as part of a process for iterating through different maturity states to determine which maturity states are present for model 124 or a highest maturity state present for model 124.

As depicted, product manager 110 can be configured to determine whether model 124 meets set of criteria 128 for selected maturity state 126 and confidence level 130 for selected maturity state 126. In this illustrative example, the set of criteria 128 specifies requirements for model 124. Confidence level 130 can be, for example, based on a confidence in at least one of a validity of model 124 or predictions made using model 124.

In other words, these requirements can be what elements are present in model 124. For example, the elements can include element types selected from at least one of content, integration, knowledge, and modeling guidance. The content can be the scope or detail of product definition. The integration can be information acquired from a relationship such as links to other models. The knowledge can be model validity or model use of model 124. The modeling guidance can be a checklist for a particular level of model maturity that is expressed as a maturity state for model 124.

As the maturity state for model 124 increases, the set of criteria 128 can require additional details for elements. For example, depending on the maturity state of model 124, the content of model 124 can have different levels of detail starting with describing product 104 without going into detail about systems, subsystems, or components in product 104.

As the maturity state increases for model 124, set of criteria 128 for the content in model 124 can progressively include systems in product 104, subsystems in product 104, and components in product 104. In the illustrative example, as the maturity state increases for model 124, set of criteria 128 changes to increase what is expected in model 124 as the maturity state increases for model 124. In the illustrative example, the amount of detail or granularity of model 124 increases as the maturity state for model 124 increases.

In this illustrative example, confidence level 130 is a level of confidence in which set of criteria 128 for selected maturity state 126 of model 124 is present. Confidence level 130 can be expressed as a percentage, a number, a term, a phrase, or in some other manner.

As depicted, in determining whether model 124 meets set of criteria 128 for selected maturity state 126 and confidence level 130 for selected maturity state 126, product manager 110 is configured to determine model type 132 for model 124. Model type 132 is a category from models 102 in which models 102 in the same category have similar or common characteristics. For example, model type 132 can be selected from one of product concept, requirements, functional, logical, operational simulation, physical, verification, and other types of models. Many models can be present for a single model type.

Further, product manager 110 can be configured to determine set of criteria 128 for selected maturity state 126 and confidence level 130 for selected maturity state 126 for model 124 from criteria 134 for maturity states 136 for model 124 and confidence levels 138 for maturity states 136 based on model type 132 for model 124 and selected maturity state 126. Additionally, product manager 110 is configured to determine whether model 124 meets set of criteria 128 and confidence level 130 for selected maturity state 126 determined using model type 132 and selected maturity state 126 for model 124.

In this illustrative example, set of criteria 128 and confidence level 130 for selected maturity state 126 can be determined from a collection of criteria 134 for maturity states 136 and confidence levels 138 for maturity states 136 for models 102. The collection of criteria 134 for maturity states 136 and confidence levels 138 for maturity states 136 for models 102 can be located in a data structure selected from at least one of a model maturity matrix, a spreadsheet, a database, a table, or some other suitable data structure.

In this illustrative example, product manager 110 performs model action 140 for product 104 using model 124 when model 124 meets set of criteria 128 for selected maturity state 126 and confidence level 130 for selected maturity state 126.

Model action 140 can take a number of different forms. For example, model action 140 can be an action performed using model 124 selected from one of performing an analysis, running a simulation, manufacturing a prototype, manufacturing a component, displaying model 124 in human machine interface 114, indicating selected maturity state 126 is present, updating model 124 to increase the maturity state of model 124, modifying the definition of product 104 and models 102 for product 104, identifying new product capabilities, or some other suitable action with respect to or using model 124.

In another illustrative example, product manager 110 can be configured to determine potential maturity states 142 for model 124 based on criteria 134 for maturity states 136 for model 124 and confidence levels 138 for maturity states 136. Product manager 110 can also be configured to determine highest potential maturity state 144 in potential maturity states 142 in which model 124 meets set of criteria 134 for highest potential maturity state 144 and model confidence level 146 for model 124 that meets confidence level 130 for highest potential maturity state 144. In this illustrative example, highest potential maturity state 144 is the maturity state for model 124.

Product manager 110 is configured to perform model action 140 for model 124 based on the maturity state determined for model 124. In the illustrative example, product manager 110 can also be configured to evaluate maturity states 136 for multiple models in models 102 rather than performing an evaluation based on choosing selected maturity state 126 for model 124. The selection of a selected maturity state can be performed as part of a number of processes to determine the highest maturity states that have been reached for multiple models in models 102.

For example, product manager 110 can be configured to identify models 102 for product 104 for evaluation. Product manager 110 can be configured to determine highest potential maturity states 148 for models 102 using criteria 134 and confidence levels 138. In this example, highest potential maturity states 148 determined for models 102 are maturity states 136 for models 102.

Product manager 110 can perform model action 140 using models 102 based on maturity states 136 for models 102 determined for models 102. The performance of these model actions in this example can be based on maturity states 136 for models 102. As result, the model actions can be performed using models 102 with a desired level of confidence that models 102 can be used for the intended purposes for maturity states 136.

Figure 2:
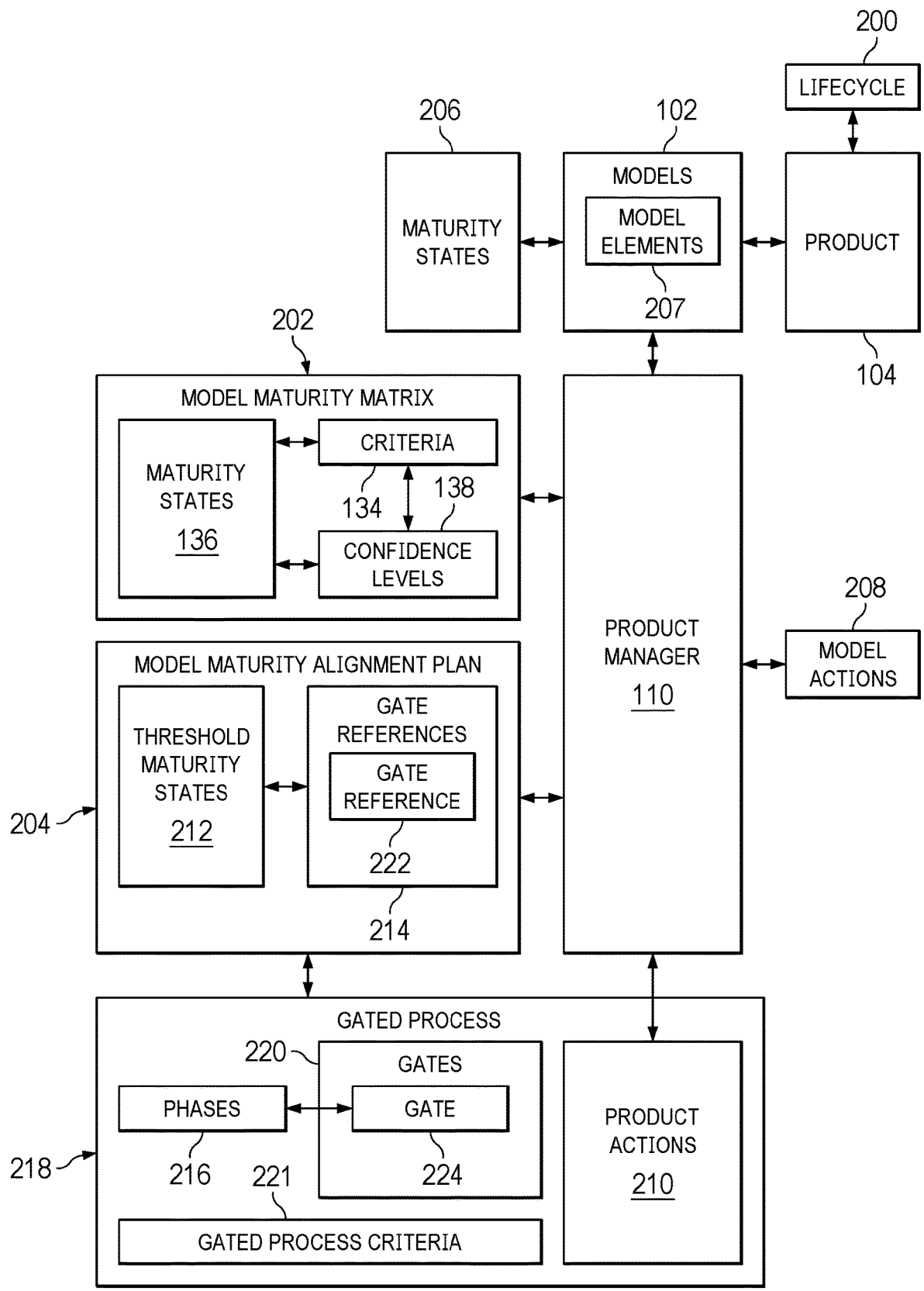
FIG. 2 is an illustration of a block diagram illustrating model development of models for use in a lifecycle of a product in accordance with an illustrative embodiment.

With reference now to FIG. 2, an illustration of a block diagram illustrating model development of models for use in a lifecycle of a product is depicted in accordance with an illustrative embodiment. In the illustrative examples, the same reference numeral may be used in more than one figure. This reuse of a reference numeral in different figures represents the same element in the different figures.

In this illustrative example, product manager 110 can manage the development of models 102 for use in lifecycle 200 of product 104. As depicted, product manager 110 can manage models 102 for product 104 during lifecycle 200 of product 104. In this depicted example, lifecycle 200 can include phases extending from inception through retirement of product 104. These phases for lifecycle 200 can be selected from at least one of design, manufacturing, testing, verification, certification, maintenance, retirement, or other phases that may be present in lifecycle 200 of product 104.

As depicted, product manager 110 manages models 102 for use during different phases of lifecycle 200 using model maturity matrix 202 and model maturity alignment plan 204. In this illustrative example, criteria 134 and confidence levels 138 for maturity states 136 are stored in a data structure in the form of model maturity matrix 202.

As depicted, each maturity state in maturity states 136 has a confidence level in confidence levels 138. Thus, a model in models 102 has a maturity state in maturity states 136 when that model meets criteria 134 for that maturity state with the confidence level in confidence levels 138 associated with that maturity state.

In this illustrative example, product manager 110 can determine a maturity state for each model in models 102 using model maturity matrix 202 to determine maturity states 206 for models 102. In this illustrative example, maturity states 206 for models 102 can be determined by comparing criteria 134 to model elements 207 in models 102.

With the determination of maturity states 206 for models 102, a set of model actions 208 can be performed by product manager 110. The set of model actions 208 can include at least one of performing an analysis, performing a simulation, manufacturing a prototype, manufacturing a component, displaying model 124 in a human machine interface, indicating selected maturity state 126 in FIG. 1 is present, or some other suitable action with respect to models 102. As another example, the set of model actions 208 can also include a specification of what operations should be performed to advance a model in models 102 from a current maturity state to the next maturity state for that model.

Further, product manager 110 can perform a set of product actions 210. In this illustrative example, product actions 210 can be performed in gated process 218. These product actions are for a phase in phases 216 in gated process 218 for the development of product 104.

Gated process 218 is a project management process in which the development of product 104 is performed in phases 216. In the illustrative example, phases 216 are separated by gates 220. A gate is a decision point used to determine whether a phase in phases 216 in gated process 218 has been completed and the next phase of the product development in gated process 218 for product 104 can begin. In the illustrative example, a gate in gates 220 is closed when all of gated process criteria 221 for the gate have been met.

As depicted, the set of product actions 210 can be determined based on what gates in gates 220 in gated process 218 are closed. Determining which gates in gates 220 are closed can be performed by product manager 110 using model maturity alignment plan 204 and gated process criteria 221 in gated process 218. Each gate in gates 220 can have different criteria in gated process criteria 221. In this illustrative example, model maturity alignment plan 204 identifies threshold maturity states 212 for models 102 for gates 220 in gated process 218.

Although a gate in gates 220 can be closed for a phase of product development with respect to models 102 meeting threshold maturity states 212 for the gate, other requirements can be present in gated process 218 to close the gate for that phase in gated process 218. Threshold maturity states 212 and these other requirements are gated process criteria 221 for gated process 218.

Each gate in gates 220 has its own criteria in gated process criteria 221. The criteria can include, for example, performing simulations, analysis, verifications, or other actions that may be specified or required for a particular gate to be closed.

As depicted, a phase in phases 216 is completed when a gate in gates 220 is closed. For example, gate 224 in gates 220 is closed when threshold maturity states 212 for gate 224 are met by maturity states 206 for models 102 and additional gated process criteria in gated process criteria 221 are met for gate 224. In the illustrative example, gated process criteria 221 for a gate includes threshold maturity states 212 for that gate.

Each phase in phases 216 can be used to determine what product actions in product actions 210 are performed in gated process 218. In the depicted example, the actions for a phase are complete when the gate for that phase is closed.

In this illustrative example, model maturity alignment plan 204 includes gate references 214 that point to gates 220 in gated process 218. For example, gate reference 222 in gate references 214 identifies threshold maturity states 212 for models 102 that are needed for gate 224 in gates 220 in the product development of product 104.

In other words, gate references 214 in model maturity alignment plan 204 indicate when models 102 meet gated process criteria 221 for gates 220 in gated process 218. For example, gate reference 222 in gate references 214 points to gate 224 in gates 220. When threshold maturity states 212 for gate reference 222 in gate references 214 are met, gated process criteria 221 for gate 224 in gates 220 is met with respect to models 102. Gate 224 can be closed when any remaining criteria in gated process criteria 221 for gate 224 has been met in gated process 218.

In this illustrative example, the set of product actions 210 can take a number of different forms. For example, the set of product actions 210 can be selected from at least one of performing a product review, performing a certification action for a regulatory requirement, assessing product readiness for manufacturing, determining whether the product can meet offering level requirements, determining a gap in a confidence level, determining a risk for performing an action in a particular production phase if models 102 do not meet the maturity states set for a gate, determining requirements missing for the next gate, or other suitable actions.

For example, product manager 110 can determine a set of gates 220 in gated process 218 that has been closed by models 102 based on maturity states 206 determined for models 102 meeting threshold maturity states 212 in model maturity alignment plan 204. In other words, product manager 110 can identify threshold maturity states 212 for a gated reference in gated references 214 that points to a gate in gates 220. Product manager 110 can determine whether maturity states 206 for models 102 meet threshold maturity states 212 specified for that particular gate based on threshold maturity states 212 specified by the gated reference in model maturity alignment plan 204 that points to the particular gate. If maturity states 206 for models 102 meet threshold maturity states 212 in the gated reference pointing to a gate, that gate is considered to be closed by models 102 in model maturity alignment plan 204.

Figure 3:
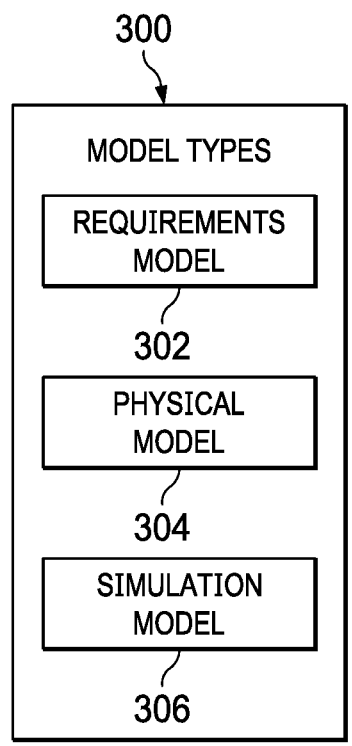
FIG. 3 is an illustration of model types in accordance with an illustrative embodiment.

With reference now to FIG. 3, an illustration of model types is depicted in accordance with an illustrative embodiment. In this example, model types 300 are a few examples of model type 132 in FIG. 1. As depicted, model types 300 comprise requirements model 302, physical model 304, and simulation model 306.

In this illustrative example, requirements model 302 is a specification of the intended product performance and design constraints with allocations to the design. As depicted, physical model 304 is an identification and design of at least one of specific parts, assemblies, tools, equipment, processes, installations, or connectivity for product 104 that can be realized through at least one of purchasing, fabrication, or assembly for product 104. Simulation model 306 is a dynamic representation of the behavior and performance of the product in the operational environment of the product.

The depicted model types in FIG. 3 are only examples and are not meant to limit the number and types of models that may be included. For example, two model types, 10 model types, or other numbers of model types may be used depending on the particular implementation. Other types of models can include, for example, a regulatory model which identifies regulatory requirements for particular components in the models. Other types of models that can be used include, for example, a prototype model for simulating prototype parts, a verification model, or some other suitable type of model.

Figure 4:
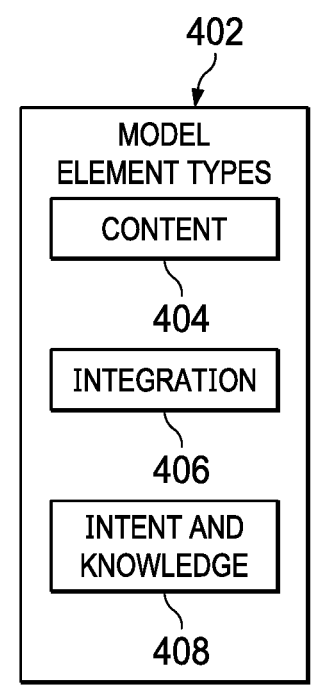
FIG. 4 is an illustration of model elements for models in accordance with an illustrative embodiment.

Turning to FIG. 4, an illustration of model elements for models is depicted in accordance with an illustrative embodiment. In this illustrative example, model element types 402 are examples of a few types of model elements 207 in models 102 in FIG. 2. In this example, each model in models 102 includes one of model element types 402. As depicted in this illustrative example, model element types 402 include content 404, integration 406, and intent and knowledge 408.

In this illustrative example, content 404 depends on the model type. At a particular maturity state, content 404 provides details about product 104 specified by the criteria for that particular maturity state. Content 404 can be a least one of a logical element, a schematic definition, a logical diagram, a geometry for a physical component, a link to another model, a description of features, an identification of parts, an application process, a material, or other suitable content.

As depicted, integration 406 describes an integration of a model with other models for product 104 in FIG. 1. Further, integration 406 can also describe integration of the model with models for other products. These other products can include, for example, production systems, maintenance systems, or aftermarket products for manufacturing product 104.

In this illustrative example, intent and knowledge 408 describes at least one of model validity or model use. For example, with a logical model, intent and knowledge 408 can be to support simulation analysis and optimization of the operation of the logical design.

The illustration of model element types 402 is provided as an example of types of elements that can be included in a model. This illustration is not meant to limit the types of model elements that can be included in other models. For example, intent and knowledge 408 is optional and can be omitted in other implementations. As another example, model element types 402 can also include keywords for indexing the model. As another example, a model can have more than one type of model element in other implementations.

In the illustrative example, criteria for maturity states can be applied to model elements to determine whether model elements meet the criteria for a particular maturity state. Further, a determination is made as to the level of confidence with which the criteria are met for a particular maturity level.

Figure 5:
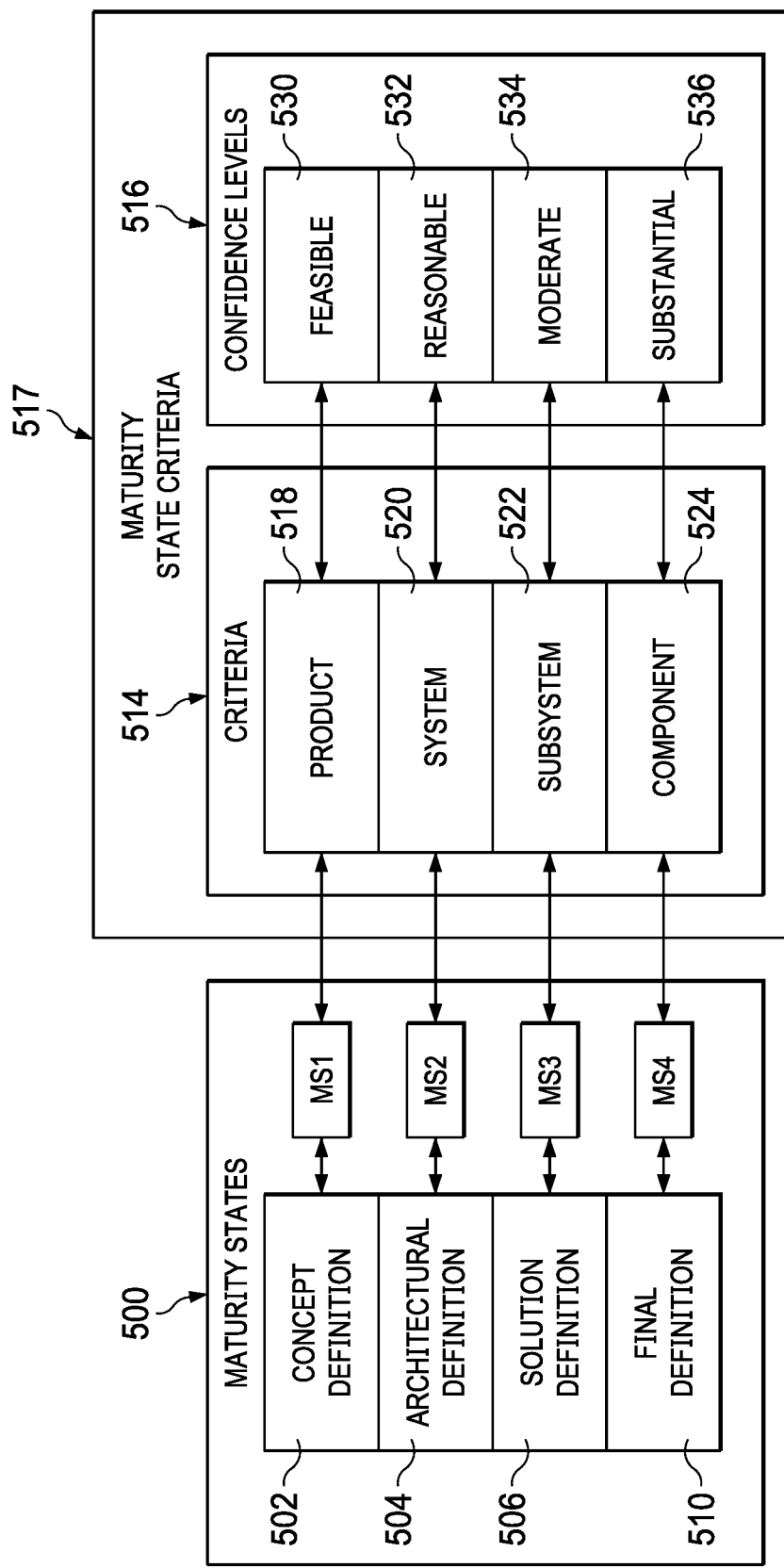
FIG. 5 is an illustration of maturity states in accordance with an illustrative embodiment.

With reference now to FIG. 5, an illustration of maturity states is depicted in accordance with an illustrative embodiment. In this illustrative example, maturity states 500 are examples of maturity states 136 in FIG. 1 and maturity states 206 in FIG. 2. Maturity states 500 can also be examples of threshold maturity states 212 in FIG. 2.

In this illustrative example, maturity states 500 include concept definition 502, architectural definition 504, solution definition 506, and final definition 508. As depicted, concept definition 502 is the lowest maturity state in maturity states 500, and final definition 508 is the highest maturity state in maturity states 500. For example, concept definition 502 is MS1; architectural definition 504 is MS2; solution definition 506 is MS3; and final definition 508 is MS4.

As depicted, criteria 514 and confidence levels 516 are present for maturity states 500. As depicted, criteria 514 and confidence levels 516 are maturity state criteria 517 for maturity states 500. In this illustrative example, criteria 514 changes for different model maturity states. In the illustrative example, the changing criteria can be based on categories.

As depicted, criteria 514 can include criteria relating to different categories of requirements based on the maturity state. For example, criteria categories for maturity states 500 can be product 518 for concept definition 502, system 520 for architectural definition 504, subsystem 522 for solution definition 506, and component 524 for final definition 508. For example, subsystem 522 can include requirements with respect to at least one of defining, describing, testing, or validating subsystems in product 104 in FIG. 1.

In this illustrative example, confidence levels 516 can increase as maturity states 500 increase. For example, confidence levels 516 for different maturity states can be, for example, feasible 530 for product 518, reasonable 532 for system 520, moderate 534 for subsystem 522, and substantial 536 for component 524.

In this illustrative example, each subsequent maturity state has additional criteria from the criteria used from a prior maturity state. In other words, as the maturity of a model increases, the amount of detail or granularity in the model can be required to increase in order to meet the criteria for a subsequent maturity state. For example, the confidence level can be with respect to the amount of model accuracy present for the criteria in a particular maturity state.

Further, the confidence level required for a maturity state can increase as the maturity state of the model increases. For example, solution definition 506 may require reasonable confidence while final definition 508 may require substantial confidence. These confidence levels can also be expressed as values or other descriptive terms.

The illustration of maturity states 500 in FIG. 5 is depicted to show one manner in which maturity states 136 in FIG. 1 or maturity states 206 in FIG. 2 can be implemented. This illustration is not meant to limit how maturity states 136 in FIG. 1 or maturity states 206 in FIG. 2 can be implemented in other illustrative examples. For example, other numbers of maturity states can be used other than the four maturity states depicted for maturity states 500. For example, three maturity states, 11 maturity states, 20 maturity states, or some other number of maturity states can be used depending on the particular implementation.

Figure 6:
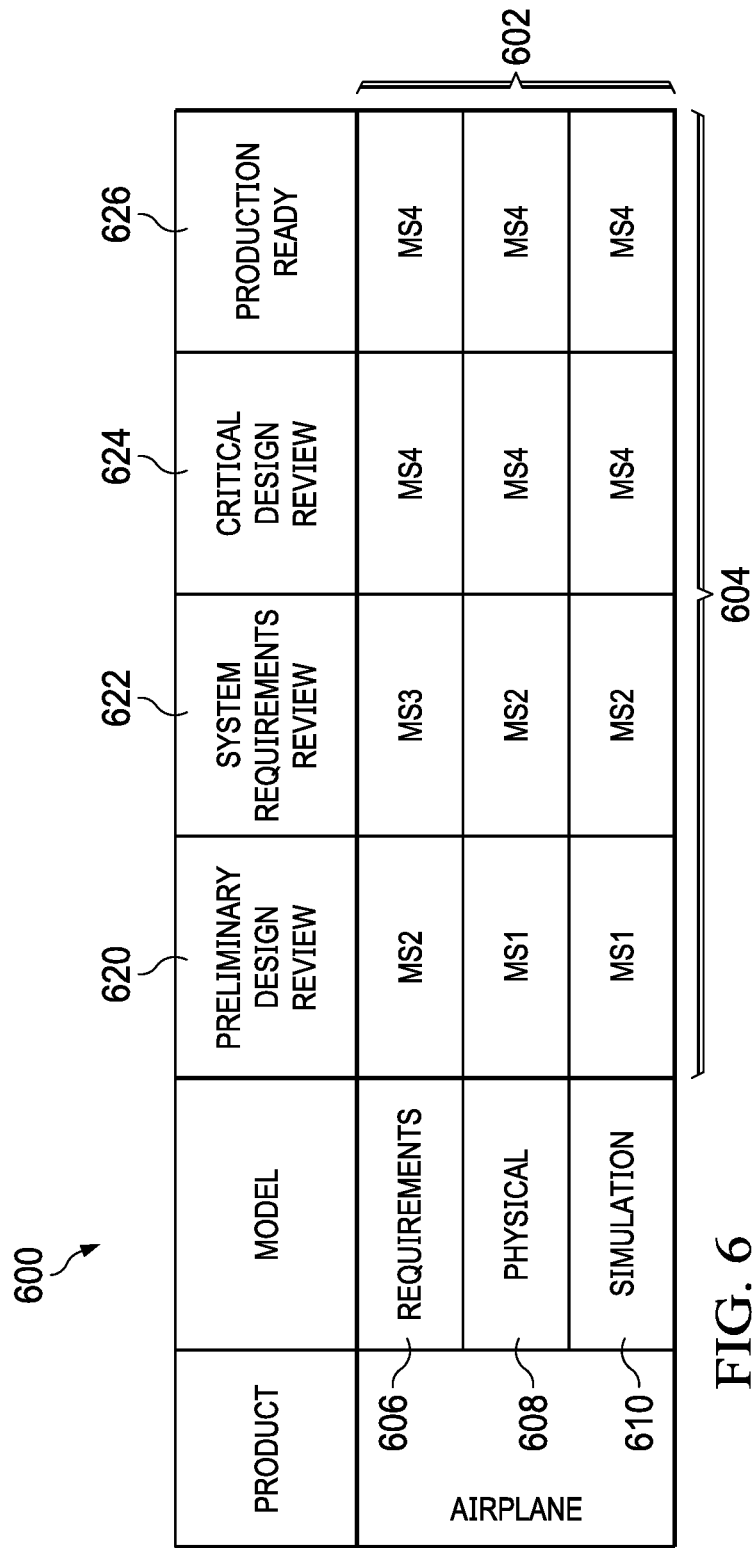
FIG. 6 is an illustration of a model maturity alignment plan in accordance with an illustrative embodiment.

Turning now to FIG. 6, an illustration of a model maturity alignment plan is depicted in accordance with an illustrative embodiment. In this illustrative example, model maturity alignment plan 600 is an example of one implementation for model maturity alignment plan 204 in FIG. 2. As depicted, product manager 110 in FIG. 1 can generate model maturity alignment plan 600 that specifies threshold maturity states for gates in model maturity alignment plan 600 with respect to the models in model maturity alignment plan 600.

In the illustrative example, a closed gate indicates a phase in product development of a product that is completed when the maturity states for the models for the product meet the threshold maturity states for the gate and other gated process criteria for that gate are met. For example, a gate in the gates is closed with respect to the models when the models meet the threshold confidence levels specified for the gate.

In this illustrative example, model maturity alignment plan 600 is depicted with information in columns and rows. As depicted, rows 602 represent models for an airplane. Columns 604 represent gate references. These gate references point to gates in a gated process. In other words, a gate reference in columns 604 can be used to identify a gate in a gated process.

As depicted, rows 602 are for the following models: requirements 606, physical 608, and simulation 610. In this illustrative example, columns 604 are gate references for gates as follows: preliminary design review 620, system requirements review 622, critical design review 624, and production ready 626. For example, preliminary design review 620 points or refers to a gate entitled "preliminary design review" in a gated process. The gate references can take other forms such as a number or some other suitable type of identifier that can be used to identify the gate in the gated process.

Each column represents a gate in model maturity alignment plan 600. The entries in columns 604 represent threshold maturity states needed by the models in rows 602 to close a corresponding gate. For example, for the gate entitled "preliminary design review" 620, the threshold maturity states for the models needed for the gate are as follows: requirements 606 is MS2, physical 608 is MS1, and simulation 610 is MS1. For the next gate, system requirements review 622, the threshold maturity states for the models are as follows: requirements 606 is MS3, physical 608 is MS2, and simulation 610 is MS2.

Models meeting threshold maturity states for a gate pointed to by a gate reference in model maturity alignment plan 600 can be used to drive model development. For example, based on the threshold maturity states needed for the next gate, a development plan can be made to develop the models to reach needed maturity states for the next gate in model maturity alignment plan 600. The threshold maturity states needed for the next gate in a gated process can be identified by the gate reference in model maturity alignment plan 600 that points to the gate.

The illustration of model maturity alignment plan 600 in FIG. 6 is an example of one manner in which model maturity alignment plan 204 in FIG. 2 can be implemented. This illustration is not meant to limit the manner in which model maturity alignment plan 204 can be implemented in other examples. For example, model maturity alignment plan 204 can be for a production system, a surface ship, a building, or some other product in addition to or in place of the airplane in model maturity alignment plan 600. Other numbers of gates or models can be used. For example, six gates, 20 gates, or some other number of gates can be present for different numbers of models.

With this depicted implementation, model maturity alignment plan 600 can be aligned with an enterprise standard gated process to provide additional gate checklist criteria.

Figure 7:
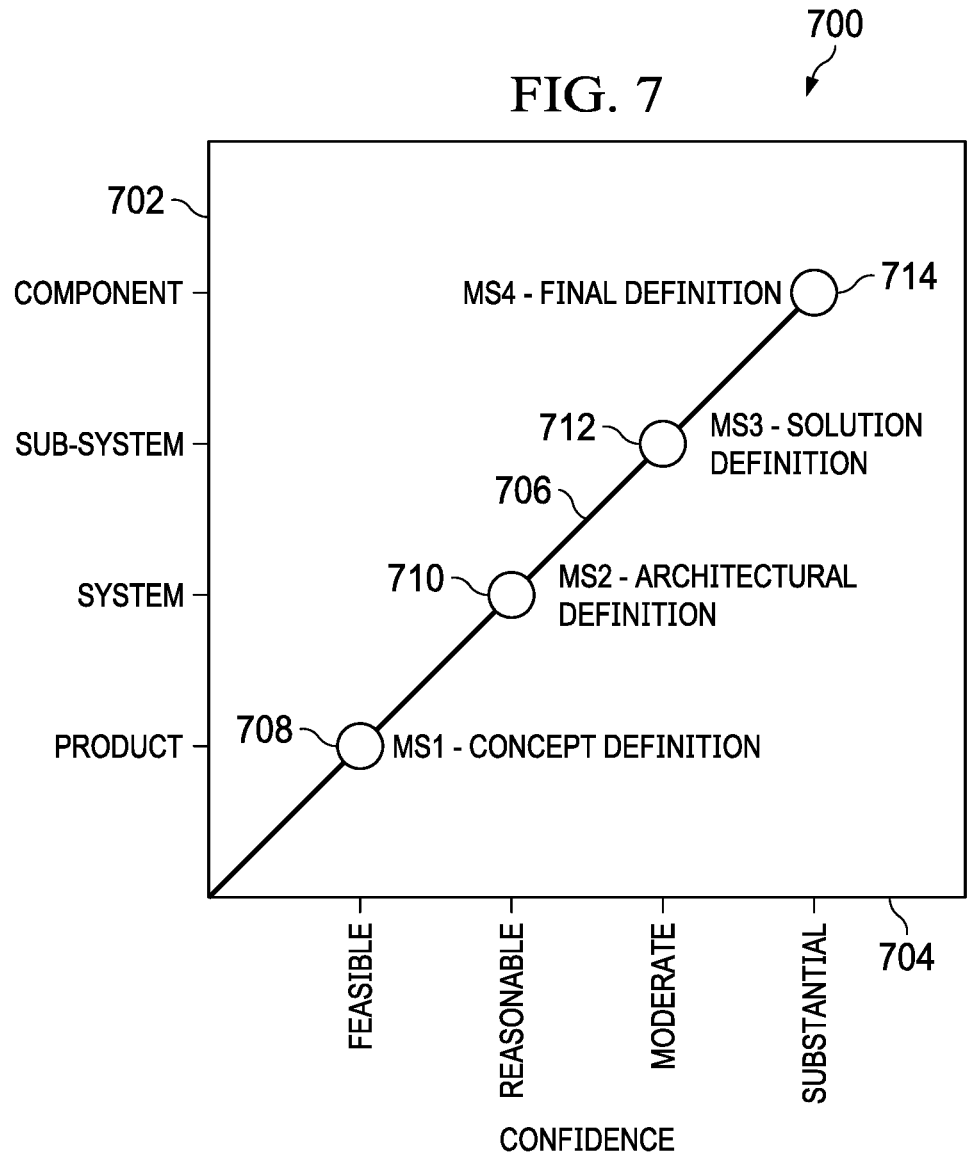
FIG. 7 is an illustration of a graph of requirements and confidence levels for maturity states in accordance with an illustrative embodiment.

Turning now to FIG. 7, an illustration of a graph of requirements and confidence levels for maturity states is depicted in accordance with an illustrative embodiment. In this illustrative example, graph 700 illustrates requirement categories on Y-axis 702 and confidence levels on X-axis 704. As depicted, line 706 depicts maturity states. As depicted, concept definition MS1 is point 708; architectural definition MS2 is point 710; solution definition MS3 is point 712; and final definition MS4 is point 714.

As depicted in this example, the confidence levels required for criteria for different maturity states increases as the maturity states increase in the development of a model. For example, the amount of specificity or detail in a model can increase as the maturity state of the model increases.

In other illustrative examples, the increase in the maturity state can involve other criteria other than an increase in detail. For example, an increase in a maturity state can include criteria for process information, inspection procedures, material information, or other items in addition to or in place of an increase in detail in the models.

Thus, one or more of the illustrative examples provide maturity states and confidence levels for the maturity states that can be selected in a manner that is unique for at least one of a particular customer, a product, an industry, a business, or other suitable factors. Further, the illustrative examples also can employ a gated process for product development using a model maturity alignment plan. With this model maturity alignment plan, particular phases of product development can be identified as being reached with respect to the maturity states for models for the product. As a result, the closing gates can enable performing product actions with a desired level of confidence that the models will provide the information needed for that phase of product development. These product actions can be performed to close the next gate after the current one.

In one illustrative example, one or more technical solutions are present that overcome a technical problem with managing models used for developing a product. As a result, one or more technical solutions in the illustrative examples can provide a technical effect of providing a technique for evaluating the maturity states for models. Further, one or more technical solutions in the illustrative examples can use these maturity states to determine what actions can be performed for a product.

Computer system 108 in FIG. 1 can be configured to perform at least one of the steps, operations, or actions described in the different illustrative examples using software, hardware, firmware, or a combination thereof. As a result, computer system 108 operates as a special purpose computer system in which product manager 110 in FIG. 1 in computer system 108 enables determining maturity states for models. In particular, product manager 110 transforms computer system 108 into a special purpose computer system as compared to currently available general computer systems that do not have product manager 110.

The illustration of model maturity environment 100 and the different components in FIGS. 1-7 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, model maturity alignment plan 204 in FIG. 2 can also include gates for one or more other products that may be related to product 104 in FIG. 1.

Figure 8:
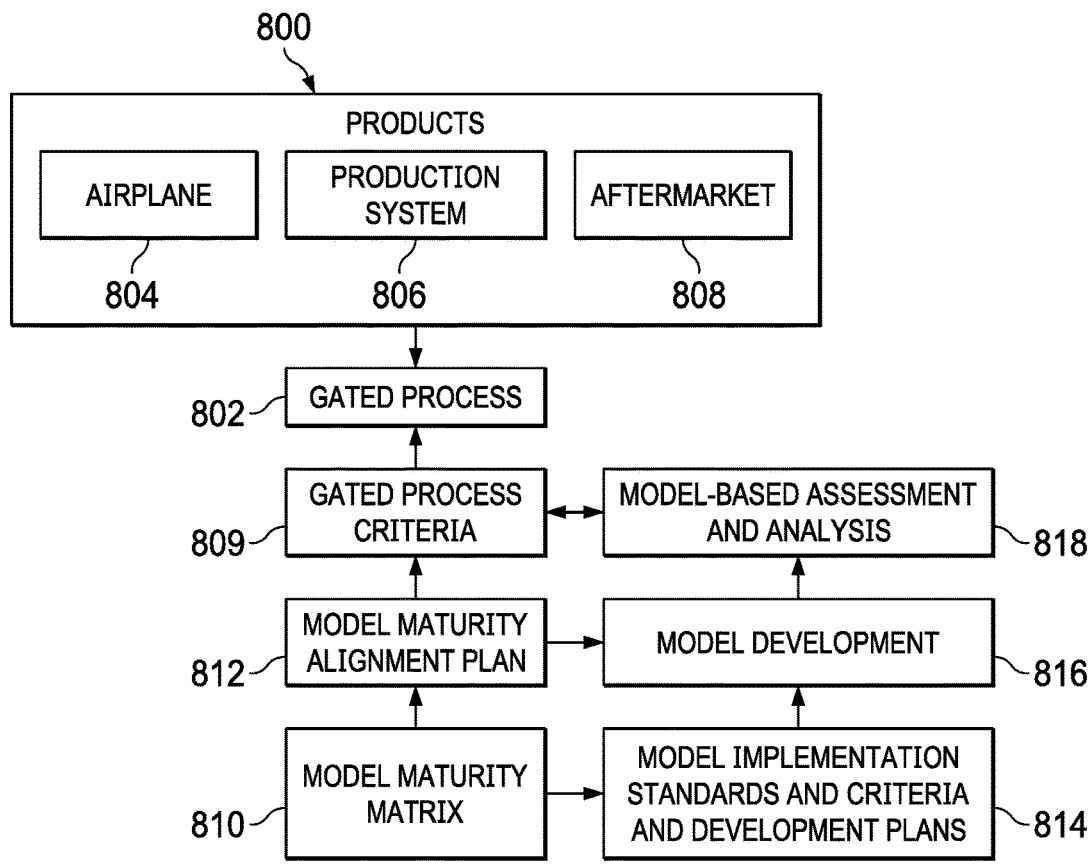
FIG. 8 is an illustration of product development in accordance with an illustrative embodiment.

With reference to FIG. 8, an illustration of product development is depicted in accordance with an illustrative embodiment. As depicted, products 800 can be developed using gated process 802. In this example, products 800 include airplane 804, production system 806, and aftermarket 808. In the illustrative example, production system 806 is developed for manufacturing airplane 804. Aftermarket 808 can include, for example, goods, services, replacement parts, upgrades, maintenance, and other items relating to airplane 804 after airplane 804 has been sold to customers.

As depicted, gated process 802 defines the development of products 800 in distinct phases. These phases are separated by gates. A gate is a decision point used to determine whether a phase has been completed and the next phase of the product development can begin. In the illustrative example, a gate is closed when all of the criteria for the gate has been met.

As depicted, gated process criteria 809 defines the criteria for phases of development in gated process 802. For example, gated process criteria 809 can define the criteria needed to close gates in gated process 802. This criteria includes threshold maturity states needed for the models using gated process 802 and other criteria for different phases of developing products 800.

Gated process criteria 809 can be used to create gated process 802. In other words, gated process criteria 809 can be used to define the phases and the criteria that need to be met for each phase in the development of products 800. Gates in gated process 802 are defined based on gated process criteria 809 for the phases in the development of products 800. Gated process criteria 809 can include criteria that are not included in model maturity matrix 810 such as scheduling, costs, and other actions needed to close gates in gated process 802.

In the illustrative example, model maturity matrix 810 is an example of model maturity matrix 202 in FIG. 2. Model maturity matrix 810 includes model maturity states that have criteria and confidence levels such those as depicted in FIG. 5.

In this illustrative example, model maturity matrix 810 defines maturity states for models for products 800. As depicted, model maturity matrix 810 is used to create model maturity alignment plan 812 for products 800. Model maturity matrix 810 can also be used to create model implementation standards and criteria and development plans 814 for use in model development.

Model maturity alignment plan 812 defines the threshold maturity levels needed for gates in gated process criteria 809 with respect to models used in gated process 802 to develop products 800. As depicted, model maturity matrix 810 can be a part of gated process criteria 809.

As depicted, model development 816 can be performed using model implementation standards and criteria and development plans 814 and model maturity alignment plan 812. In this illustrative example, model development 816 can be performed by human operators to develop models for products 800.

Model development 816 can be used to develop models to reach maturity states needed for particular phases in gated process 802 using model maturity alignment plan 812. For example, the amount of detail and confidence level in the detail of models can be developed to meet threshold maturity states in model maturity alignment plan 812 to close gates in gated process 802 with respect to models used in gated process 802.

Model-based assessment and analysis 818 can be performed to assess maturity of models to determine whether a gate can be closed in gated process 802. Model-based assessment and analysis 818 can be implemented in product manager 110 in FIG. 1. For example, when the maturity states for models meet the threshold maturity states for a gate in gated process 802, those models can be used to perform other actions to meet gated process criteria 809 to close the gate in gated process 802.

For example, the models can be used to perform a simulation, an analysis, a presentation, or other actions that can be used to create artifacts. In the illustrative example, artifacts are items that prove that the criteria has been met for the gate in gated process 802. This analysis can be performed using product manager 110 in FIG. 1. Further, model-based assessment and analysis 818 enables assessing the risk for proceeding with the development of products 800 when a gate in gated process 802 is not closed.

The illustrations of the use of model maturity alignment plan 812 and model maturity matrix 810 in gated process 802 to develop products 800 are presented as an example of one manner in which the development of products 800 can be performed. These illustrations are not meant to limit the manner in which product development can be performed.

For example, in some illustrative examples, products 800 may comprise only a single product or may include other products in addition to or in place of airplane 804, production system 806, and aftermarket 808. For example, products 800 can also include a surface ship, a train, or some other product in addition to or in place of airplane 804. As another example, although model maturity alignment plan 812 and model maturity matrix 810 have been described as being present for products 800, a model maturity alignment plan and a model maturity matrix may be present for each product in other illustrative examples.

Figure 9:
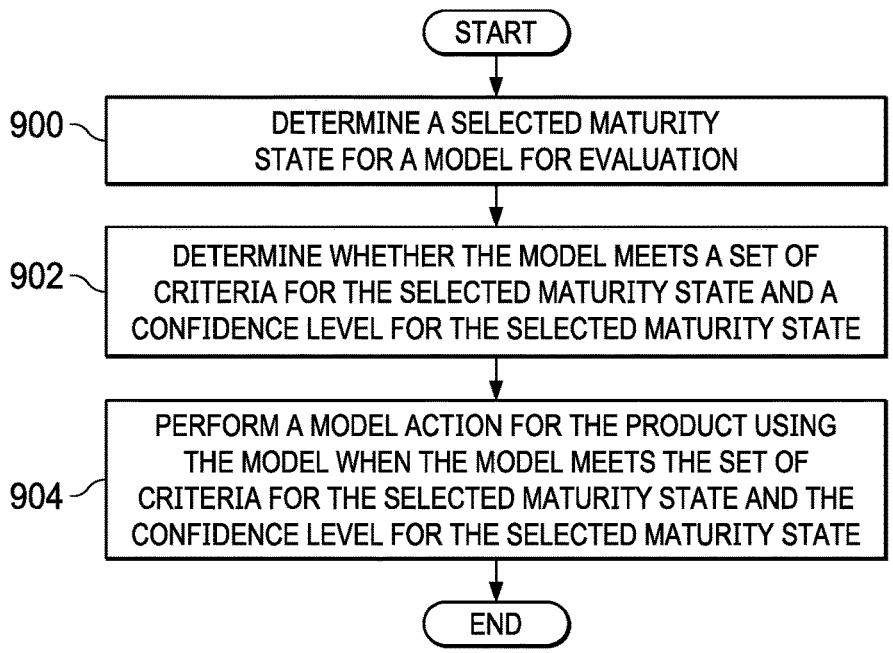
FIG. 9 is an illustration of a flowchart of a process for evaluating a maturity of a model for a product in accordance with an illustrative embodiment.

Turning next to FIG. 9, an illustration of a flowchart of a process for evaluating a maturity of a model for a product is depicted in accordance with an illustrative embodiment. The process in FIG. 9 can be implemented in hardware, software, or both. When implemented in software, the process can take the form of program code that is run by one or more processor units located in one or more hardware devices in one or more computer systems. For example, the process can be implemented in product manager 110 in computer system 108 in FIG. 1.

The process begins by determining a selected maturity state for a model for evaluation (operation 900). In operation 900, the selected maturity state is a maturity state for which a model is to be evaluated. In other words, the model is evaluated to determine whether the model meets the selected maturity state. This determination of the selected maturity state can be made through at least one of a user input from a human operator or input from a software process or component such as product manager 110 in FIG. 1.

The process determines whether the model meets a set of criteria for the selected maturity state and a confidence level for the selected maturity state (operation 902). For example, the process can request user input for a set of questions related to the set of criteria for the selected maturity state, wherein the input is used in comparing the model to the set of criteria.

The process performs a model action for the product using the model when the model meets the set of criteria for the selected maturity state and the confidence level for the selected maturity state (operation 904). The process terminates thereafter.

Figure 10:
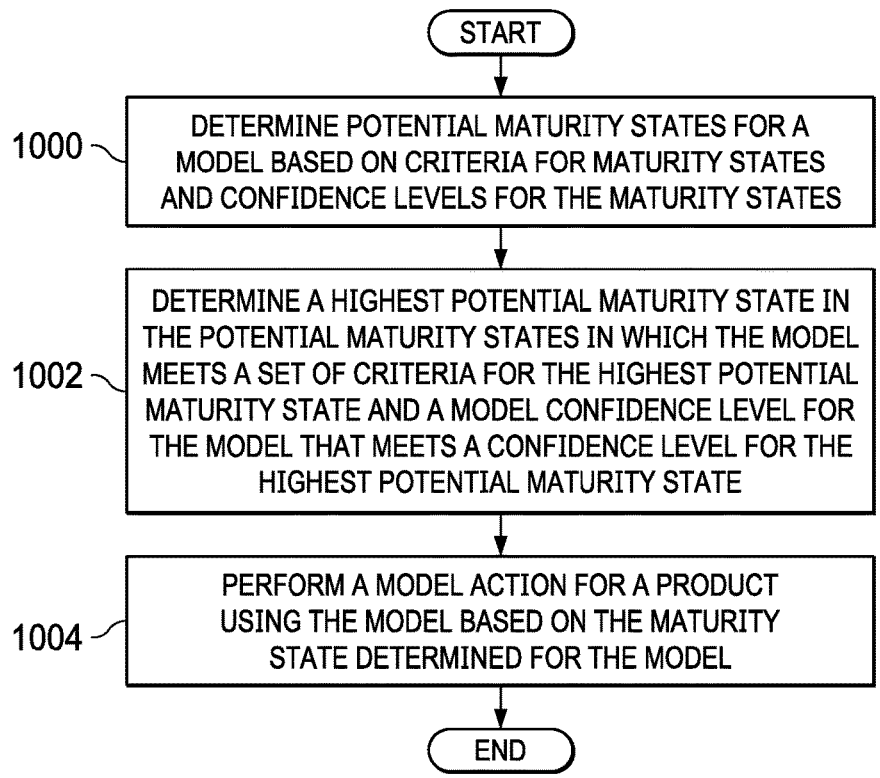
FIG. 10 is an illustration of a flowchart of a process for evaluating a maturity of a model for a product in accordance with an illustrative embodiment.

Turning now to FIG. 10, an illustration of a flowchart of a process for evaluating a maturity of a model for a product is depicted in accordance with an illustrative embodiment. The process in FIG. 10 can be implemented in hardware, software, or both. When implemented in software, the process can take the form of program code that is run by one or more processor units located in one or more hardware devices in one or more computer systems. For example, the process can be implemented in product manager 110 in computer system 108 in FIG. 1.

The process begins by determining potential maturity states for a model based on criteria for maturity states and confidence levels for the maturity states (operation 1000). In this illustrative example, operation 1000 can be performed by using the process in FIG. 9 in which a determination is made as to whether a model meets a selected maturity state for a model for evaluation on an iterative basis. Each of the selected maturity states identified as being met by the model using the process in FIG. 9 is a potential maturity state determined for the model in operation 1000.

The process determines a highest potential maturity state in the potential maturity states in which the model meets a set of criteria for the highest potential maturity state and a model confidence level for the model that meets a confidence level for the highest potential maturity state (operation 1002). In operation 1002, the highest potential maturity state is a maturity state for the model.

The process performs a model action for a product using the model based on the maturity state determined for the model (operation 1004). The process terminates thereafter.

Figure 11:
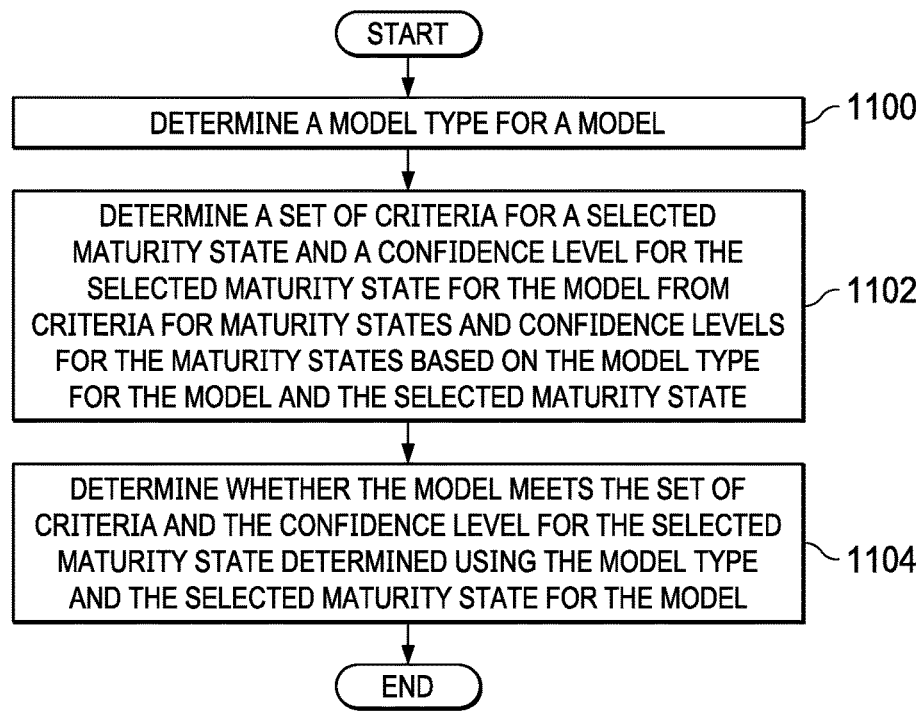
FIG. 11 is an illustration of a flowchart of a process for determining whether a model meets a set of criteria and a confidence level for a selected maturity state in accordance with an illustrative embodiment.

With reference to FIG. 11, an illustration of a flowchart of a process for determining whether a model meets a set of criteria and a confidence level for a selected maturity state is depicted in accordance with an illustrative embodiment. The process in FIG. 11 is an example of one implementation for operation 902 in FIG. 9.

The process begins by determining a model type for a model (operation 1100). The process determines a set of criteria for a selected maturity state and a confidence level for the selected maturity state for the model from criteria for maturity states and confidence levels for the maturity states based on a model type for the model and the selected maturity state (operation 1102).

The process determines whether the model meets the set of criteria and the confidence level for the selected maturity state determined using the model type and the selected maturity state for the model (operation 1104). The process terminates thereafter.

In operation 1104, the determination of whether the model meets the set of criteria can be determined using artifacts. Artifacts are things used to prove that the criteria are met. The artifacts can include items produced during the development of the product. The artifacts can include, for example, a use case, a diagram, a design document, a simulation result, a verification by a human operator, or some other suitable type of proof that the criteria has been met.

Figure 12:
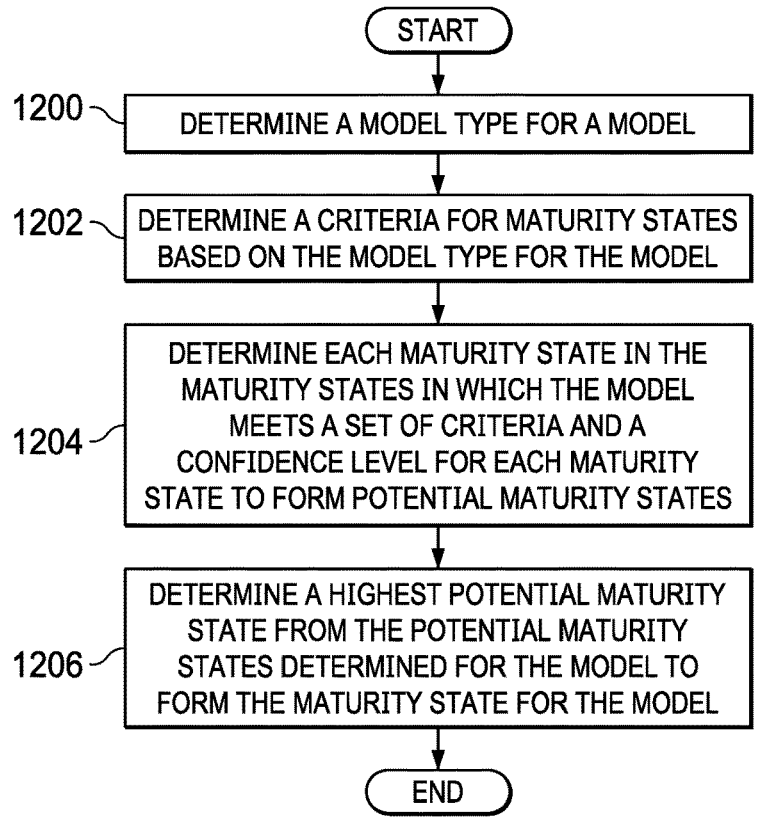
FIG. 12 is an illustration of a flowchart of a process for determining a highest potential maturity state for a model in accordance with an illustrative embodiment.

With reference to FIG. 12, an illustration of a flowchart of a process for determining a highest potential maturity state for a model is depicted in accordance with an illustrative embodiment. The process in FIG. 12 is an example of one implementation for operation 1002 in FIG. 10.

The process begins by determining a model type for a model (operation 1200). The process determines a criteria for maturity states based on the model type for the model (operation 1202). The process determines the confidence levels for the maturity states.

The process determines each maturity state in the maturity states in which the model meets a set of criteria and a confidence level for each maturity state to form potential maturity states (operation 1204). The process determines the highest potential maturity state from the potential maturity states determined for the model to form the maturity state for the model (operation 1206). The process terminates thereafter.

Figure 13:
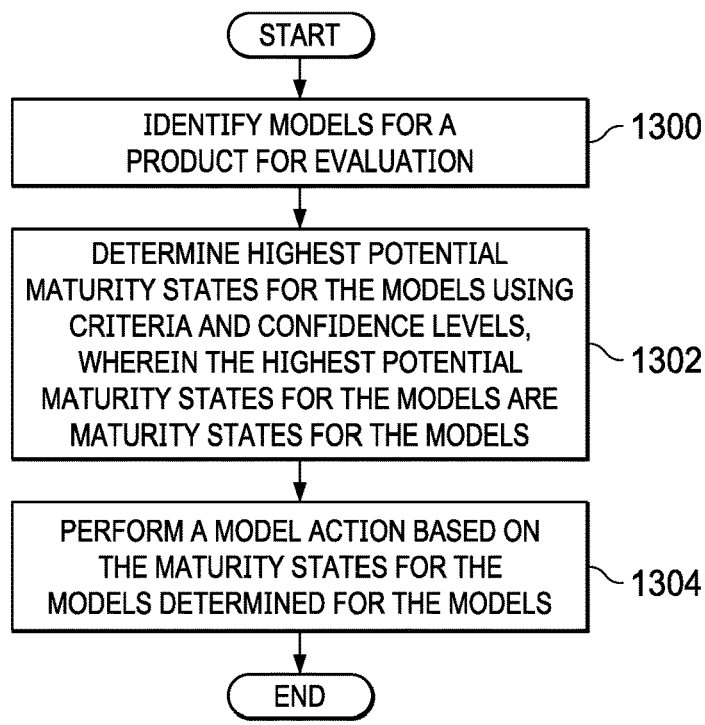
FIG. 13 is an illustration of a flowchart of a process for evaluating maturity of models for the product in accordance with an illustrative embodiment.

With reference next to FIG. 13, an illustration of a flowchart of a process for evaluating maturity of models for a product is depicted in accordance with an illustrative embodiment. The process in FIG. 13 can be implemented in hardware, software, or both. When implemented in software, the process can take the form of program code that is run by one or more processor units located in one or more hardware devices in one or more computer systems. For example, the process can be implemented in product manager 110 in computer system 108 in FIG. 1.

The process begins by identifying models for a product for evaluation (operation 1300). The process determines highest potential maturity states for the models using criteria and confidence levels, wherein the highest potential maturity states for the models are maturity states for the models (operation 1302).

The process performs a model action based on the maturity states for the models determined for the models (operation 1304). The process terminates thereafter.

Figure 14:
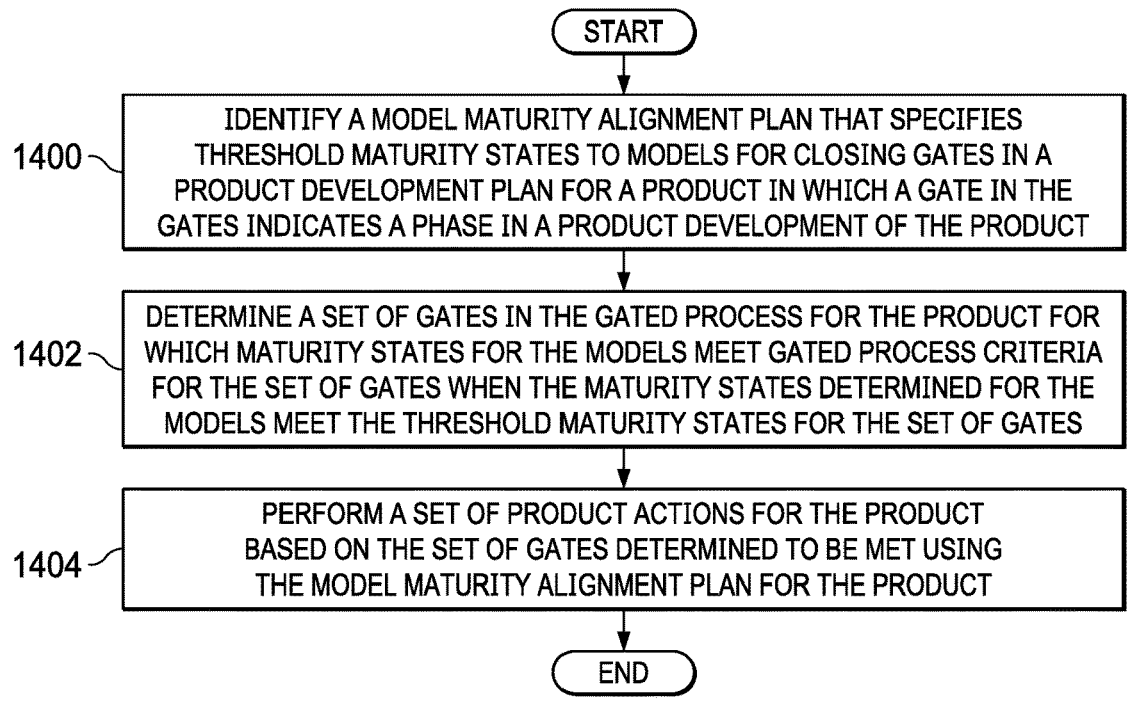
FIG. 14 is an illustration of a flowchart of a process for performing product action based on the maturity states for the models determined for the models in accordance with an illustrative embodiment.

Turning next to FIG. 14, an illustration of a flowchart of a process for performing a product action based on maturity states for models determined for the models is depicted in accordance with an illustrative embodiment. The process illustrated in FIG. 14 is an example of one manner in which operation 1304 in FIG. 13 can be implemented.

The process begins by identifying a model maturity alignment plan that specifies threshold maturity states to models for closing gates in a product development plan for a product in which a gate in the gates indicates a phase in a product development of the product (operation 1400). The process determines a set of gates in the gated process for the product for which maturity states for the models meet gated process criteria for the set of gates when the maturity states determined for the models meet the threshold maturity states for the set of gates (operation 1402).

Based on the gates closed, the process can perform a set of product actions for the product based on the set of gates determined to be met using the model maturity alignment plan for the product (operation 1404). The process terminates thereafter.

Figure 15:
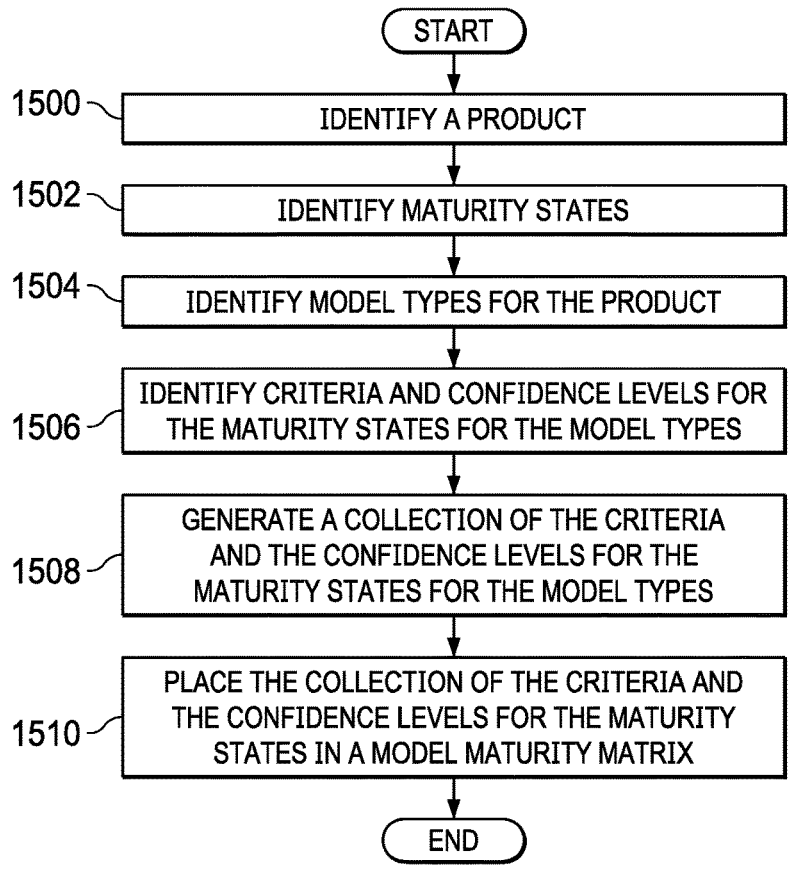
FIG. 15 is an illustration of a flowchart of a process for creating maturity model matrix in accordance with an illustrative embodiment.

In FIG. 15, an illustration of a flowchart of a process for creating a maturity model matrix is depicted in accordance with an illustrative embodiment. The process in FIG. 15 can be implemented in hardware, software, or both. When implemented in software, the process can take the form of program code that is run by one or more processor units located in one or more hardware devices in one or more computer systems. For example, the process can be implemented in product manager 110 in computer system 108 in FIG. 1. These processes can be used to create model maturity matrix 202 in FIG. 2.

The process begins by identifying a product (operation 1500). The process identifies maturity states (operation 1502). In operation 1502, the process identifies the maturity states and a sequence for the maturity states in which the product will be designed and models will be developed. The process identifies model types for the product (operation 1504).

The process identifies criteria and confidence levels for the maturity states for the model types (operation 1506). The process generates a collection of the criteria and the confidence levels for the maturity states for the model types (operation 1508). In operation 1508, the criteria can be for, for example, required content, integration between models, and model use.

The process places the collection of the criteria and the confidence levels for the maturity states in a model maturity matrix (operation 1510). The process terminates thereafter.

In other illustrative examples, this information can be placed in a data structure in addition to or in place of a model maturity matrix. For example, information can be placed in a spreadsheet, a database, a table, or in some other suitable type of data structure. Further, this information can be distributed among multiple data structures in some illustrative examples.

Figure 16:
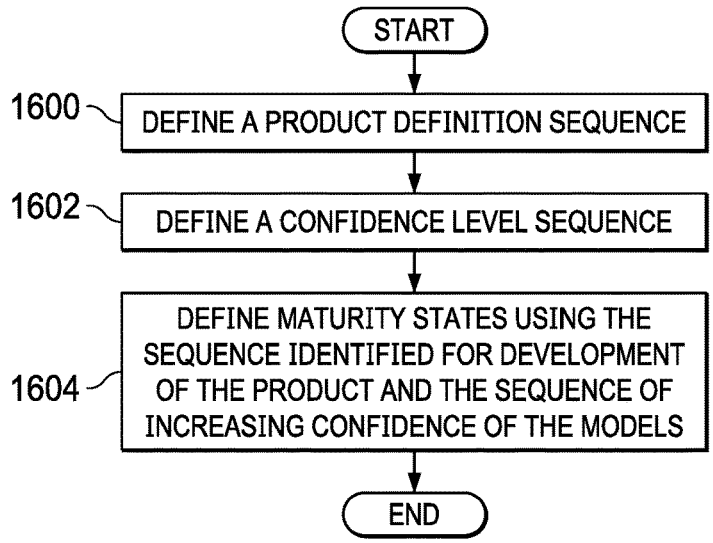
FIG. 16 is an illustration of a flowchart of a process for identifying maturity states and confidence levels for a product in accordance with an illustrative embodiment.

With reference now to FIG. 16, an illustration of a flowchart of a process for identifying maturity states and confidence levels for a product is depicted in accordance with an illustrative embodiment. The process in FIG. 16 is an example of one manner in which operation 1504 in FIG. 15 can be implemented.

The process begins by defining a product definition sequence (operation 1600). This operation identifies a sequence in which the product will be designed and models will be developed.

The process defines a confidence level sequence (operation 1602). Operation 1602 involves determining a sequence of increasing confidence that the models meeting the criteria of a maturity state correctly describe or predict at least one of the product, components in the product, performance of the product, or some other item.

The process then defines maturity states using the sequence identified for development of the product and the sequence of increasing confidence of the models (operation 1604). The process terminates thereafter.

Figure 17:
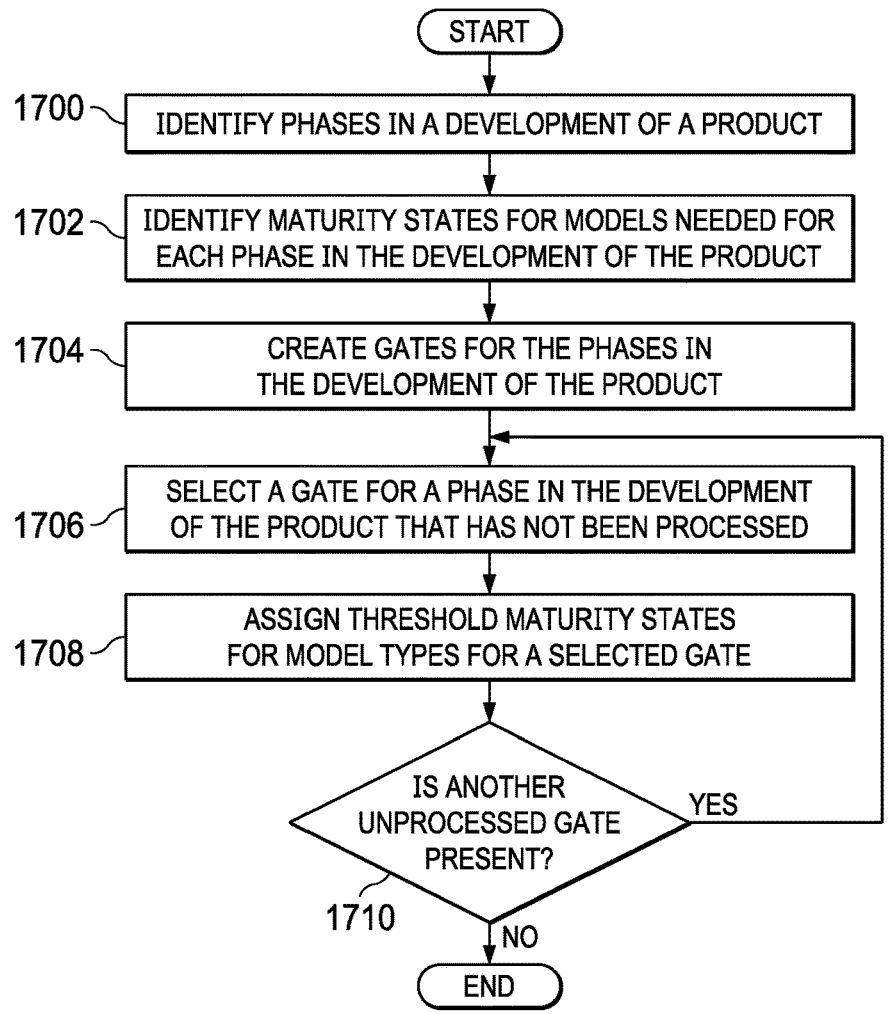
FIG. 17 is an illustration of a flowchart of a process for creating maturity model alignment plan accordance with an illustrative embodiment.

Turning now to FIG. 17, an illustration of a flowchart of a process for creating a maturity model alignment plan is depicted in accordance with an illustrative embodiment. The process in FIG. 17 can be implemented in hardware, software, or both. When implemented in software, the process can take the form of program code that is run by one or more processor units located in one or more hardware devices in one or more computer systems. For example, the process can be implemented in product manager 110 in computer system 108 in FIG. 1. These processes can be used to create model maturity matrix 202 in FIG. 2.

The process begins by identifying phases in a development of a product (operation 1700). The process identifies maturity states for models needed for each phase in the development of the product (operation 1702). The process creates gates for the phases in the development of the product (operation 1704).

The process selects a gate for a phase in the development of the product that has not been processed (operation 1706). The process then assigns threshold maturity states for model types for a selected gate (operation 1708). These model maturity states can be selected based on what information is known or needed from a model at the particular gate representing a phase in the product development.

The process then determines whether another unprocessed gate is present (operation 1710). If another gate is present, the process returns to operation 1706. Otherwise, the process terminates.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 18:
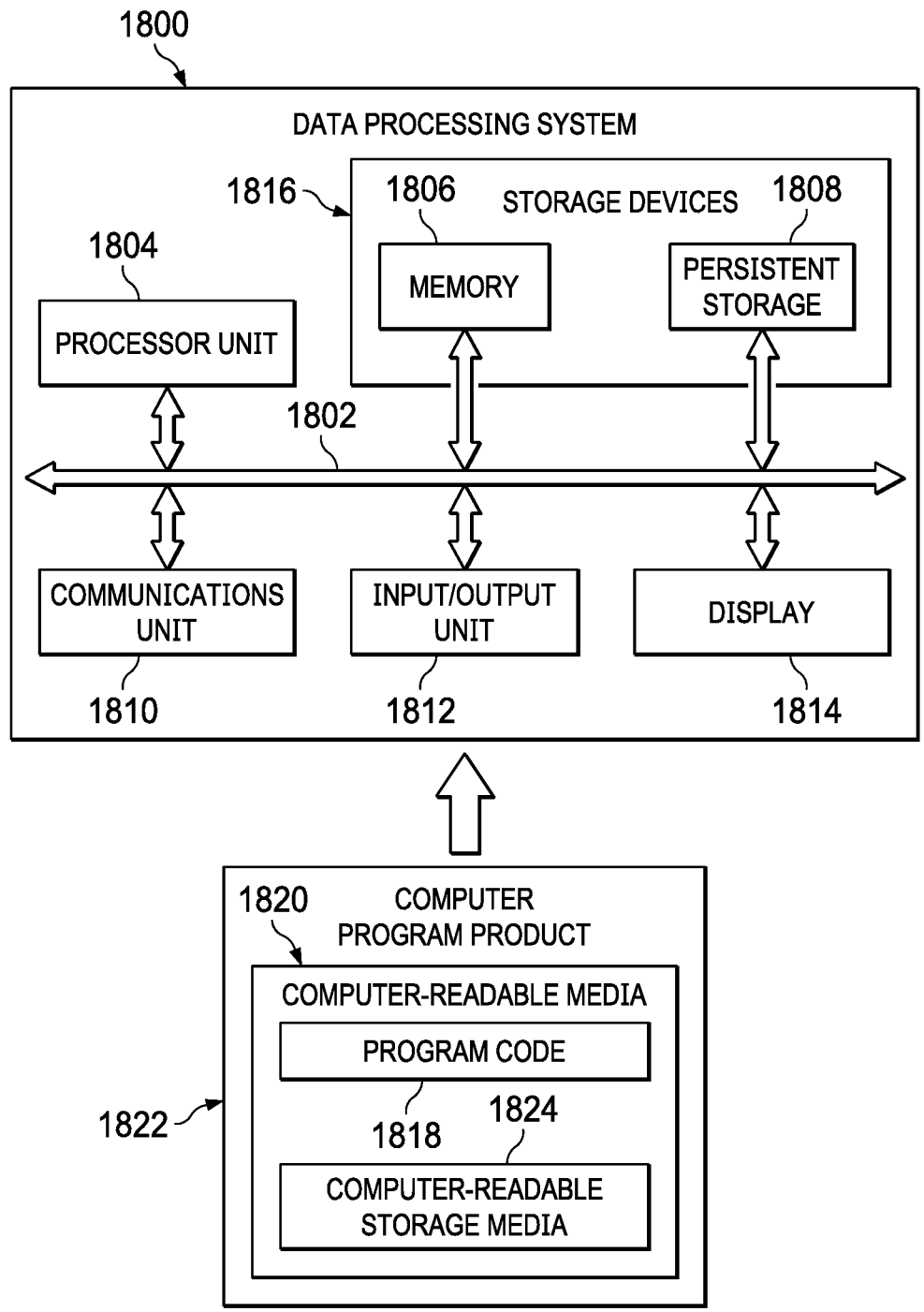
FIG. 18 is an illustration of a block diagram of a data processing system in accordance with an illustrative embodiment.

Turning now to FIG. 18, an illustration of a block diagram of a data processing system is depicted in accordance with an illustrative embodiment. Data processing system 1800 can be used to implement computer system 108 in FIG. 1. In this illustrative example, data processing system 1800 includes communications framework 1802, which provides communications between processor unit 1804, memory 1806, persistent storage 1808, communications unit 1810, input/output (I/O) unit 1812, and display 1814. In this example, communications framework 1802 takes the form of a bus system.

Processor unit 1804 serves to execute instructions for software that can be loaded into memory 1806. Processor unit 1804 includes one or more processors. For example, processor unit 1804 can be selected from at least one of a multicore processor, a central processing unit (CPU), a graphics processing unit (GPU), a physics processing unit (PPU), a digital signal processor (DSP), a network processor, or some other suitable type of processor.

Memory 1806 and persistent storage 1808 are examples of storage devices 1816. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1816 may also be referred to as computer-readable storage devices in these illustrative examples. Memory 1806, in these examples, can be, for example, a random-access memory or any other suitable volatile or non-volatile storage device. Persistent storage 1808 can take various forms, depending on the particular implementation.

For example, persistent storage 1808 may contain one or more components or devices. For example, persistent storage 1808 can be a hard drive, a solid-state drive (SSD), a flash memory, a rewritable optical disk, a rewritable magnetic tape, or some combination of the above. The media used by persistent storage 1808 also can be removable. For example, a removable hard drive can be used for persistent storage 1808.

Communications unit 1810, in these illustrative examples, provides for communications with other data processing systems or devices. In these illustrative examples, communications unit 1810 is a network interface card.

Input/output unit 1812 allows for input and output of data with other devices that can be connected to data processing system 1800. For example, input/output unit 1812 can provide a connection for user input through at least one of a keyboard, a mouse, or some other suitable input device. Further, input/output unit 1812 can send output to a printer. Display 1814 provides a mechanism to display information to a user.

Instructions for at least one of the operating system, applications, or programs can be located in storage devices 1816, which are in communication with processor unit 1804 through communications framework 1802. The processes of the different embodiments can be performed by processor unit 1804 using computer-implemented instructions, which can be located in a memory, such as memory 1806.

These instructions are referred to as program code, computer usable program code, or computer-readable program code that can be read and executed by a processor in processor unit 1804. The program code in the different embodiments can be embodied on different physical or computer-readable storage medium, such as memory 1806 or persistent storage 1808.

Program code 1818 is located in a functional form on computer-readable medium 1820 that is selectively removable and can be loaded onto or transferred to data processing system 1800 for execution by processor unit 1804. Program code 1818 and computer-readable medium 1820 form computer program product 1822 in these illustrative examples. In the illustrative example, computer-readable medium 1820 is computer-readable storage medium 1824.

In these illustrative examples, computer-readable storage medium 1824 is a physical or tangible storage device used to store program code 1818 rather than a medium that propagates or transmits program code 1818. Computer-readable storage medium 1824, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Alternatively, program code 1818 can be transferred to data processing system 1800 using a computer-readable signal media. The computer-readable signal media can be, for example, a propagated data signal containing program code 1818. For example, the computer-readable signal media can be at least one of an electromagnetic signal, an optical signal, or any other suitable type of signal. These signals can be transmitted over connections, such as wireless connections, optical fiber cable, coaxial cable, a wire, or any other suitable type of connection.

The different components illustrated for data processing system 1800 are not meant to provide architectural limitations to the manner in which different embodiments can be implemented. In some illustrative examples, one or more of the components may be incorporated in or otherwise form a portion of, another component. For example, memory 1806, or portions thereof, can be incorporated in processor unit 1804 in some illustrative examples. The different illustrative embodiments can be implemented in a data processing system including components in addition to or in place of those illustrated for data processing system 1800. Other components shown in FIG. 18 can be varied from the illustrative examples shown. The different embodiments can be implemented using any hardware device or system capable of running program code 1818.

Figure 19:
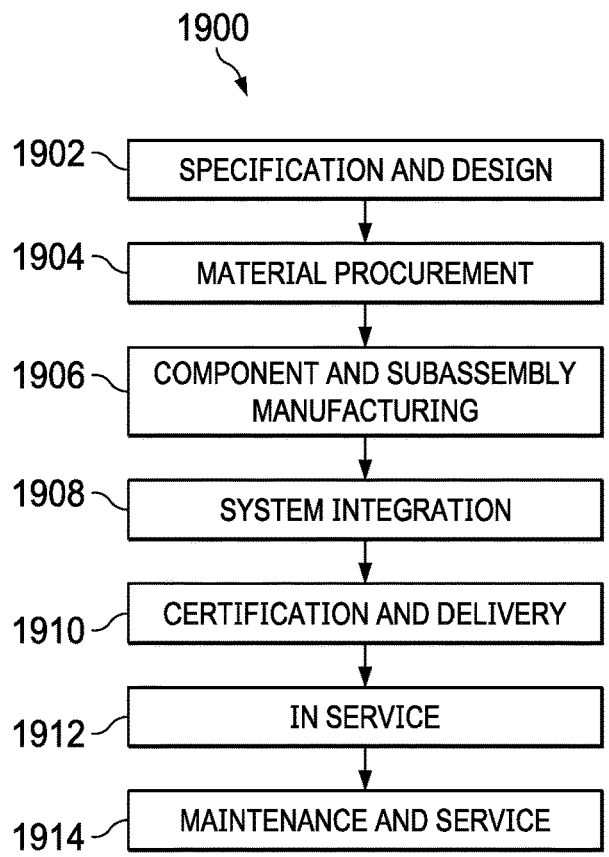
FIG. 19 is an illustration of an aircraft manufacturing and service method in accordance with an illustrative embodiment.
Figure 20:
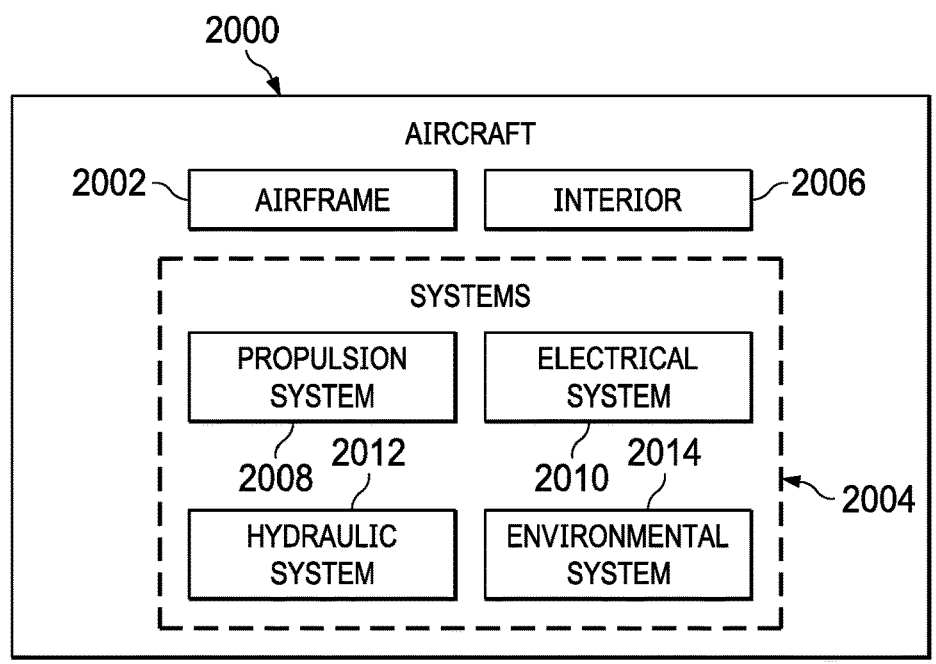
FIG. 20 is an illustration of a block diagram of an aircraft in which an illustrative embodiment may be implemented.

Illustrative embodiments of the disclosure may be described in the context of aircraft manufacturing and service method 1900 as shown in FIG. 19 and aircraft 2000 as shown in FIG. 20. Turning first to FIG. 19, an illustration of an aircraft manufacturing and service method is depicted in accordance with an illustrative embodiment. During pre-production, aircraft manufacturing and service method 1900 may include specification and design 1902 of aircraft 2000 in FIG. 20 and material procurement 1904.

During production, component and subassembly manufacturing 1906 and system integration 1908 of aircraft 2000 in FIG. 20 takes place. Thereafter, aircraft 2000 in FIG. 20 can go through certification and delivery 1910 in order to be placed in service 1912. While in service 1912 by a customer, aircraft 2000 in FIG. 20 is scheduled for routine maintenance and service 1914, which may include modification, reconfiguration, refurbishment, and other maintenance or service.

Each of the processes of aircraft manufacturing and service method 1900 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 20, an illustration of an aircraft is depicted in which an illustrative embodiment may be implemented. In this example, aircraft 2000 is produced by aircraft manufacturing and service method 1900 in FIG. 19 and may include airframe 2002 with plurality of systems 2004 and interior 2006. Examples of systems 2004 include one or more of propulsion system 2008, electrical system 2010, hydraulic system 2012, and environmental system 2014. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1900 in FIG. 19.

In one illustrative example, components or subassemblies produced in component and subassembly manufacturing 1906 in FIG. 19 can be fabricated or manufactured in a manner similar to components or subassemblies produced while aircraft 2000 is in service 1912 in FIG. 19. As yet another example, one or more apparatus embodiments, method embodiments, or a combination thereof can be utilized during production stages, such as component and subassembly manufacturing 1906 and system integration 1908 in FIG. 19.

One or more apparatus embodiments, method embodiments, or a combination thereof may be utilized while aircraft 2000 is in service 1912, during maintenance and service 1914 in FIG. 19, or both. The use of a number of the different illustrative embodiments may substantially expedite the assembly of aircraft 2000, reduce the cost of aircraft 2000, or both expedite the assembly of aircraft 2000 and reduce the cost of aircraft 2000.

For example, product manager 110 in FIG. 1 can be used to develop models for the production of aircraft 2000. These models can be used during the various phases of manufacturing and service method 1900 as part of a computer-based engineering (CBE) environment that is used to develop models for use during the lifecycle of aircraft 2000. For example, the models can be developed using product manager 110 during specification and design 1902. These models can then be used during other phases to direct or verify the manufacturing of aircraft 2000. Further, these models can also be used to provide services including maintenance and service 1914 after aircraft 2000 is in service 1912.

Figure 21:
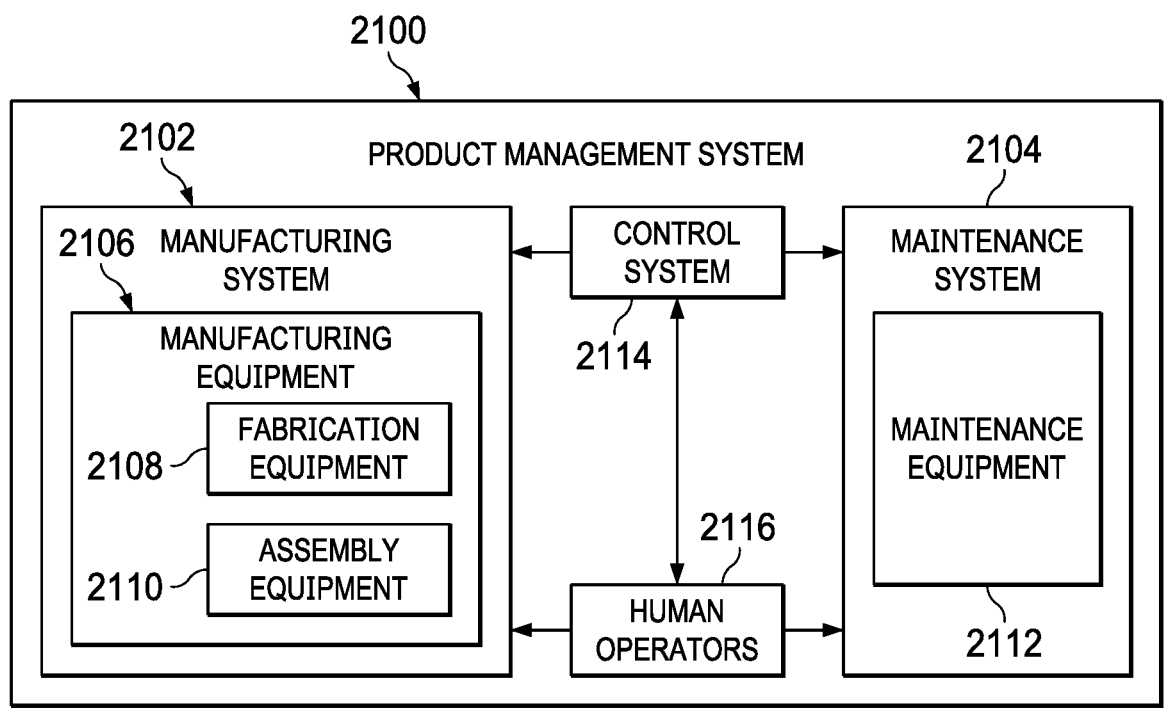
FIG. 21 is an illustration of a block diagram of a product management system in accordance with an illustrative embodiment.

Turning now to FIG. 21, an illustration of a block diagram of a product management system is depicted in accordance with an illustrative embodiment. Product management system 2100 is a physical hardware system. In this illustrative example, product management system 2100 includes at least one of manufacturing system 2102 or maintenance system 2104. Product management system 2100 can also include product manager 110 to develop models 102 for use in manufacturing products such as aircraft 2000 in FIG. 20.

Manufacturing system 2102 is configured to manufacture products, such as aircraft 2000 in FIG. 20. As depicted, manufacturing system 2102 includes manufacturing equipment 2106. Manufacturing equipment 2106 includes at least one of fabrication equipment 2108 or assembly equipment 2110.

Fabrication equipment 2108 is equipment that used to fabricate components for parts used to form aircraft 2000 in FIG. 20. For example, fabrication equipment 2108 can include machines and tools. These machines and tools can be at least one of a drill, a hydraulic press, a furnace, a mold, a composite tape laying machine, a vacuum system, a lathe, or other suitable types of equipment. Fabrication equipment 2108 can be used to fabricate at least one of metal parts, composite parts, semiconductors, circuits, fasteners, ribs, skin panels, spars, antennas, or other suitable types of parts.

Assembly equipment 2110 is equipment used to assemble parts to form aircraft 2000 in FIG. 20. In particular, assembly equipment 2110 is used to assemble components and parts to form aircraft 2000 in FIG. 20. Assembly equipment 2110 also can include machines and tools. These machines and tools may be at least one of a robotic arm, a crawler, a faster installation system, a rail-based drilling system, or a robot. Assembly equipment 2110 can be used to assemble parts such as seats, horizontal stabilizers, wings, engines, engine housings, landing gear systems, and other parts for aircraft 2000 in FIG. 20.

In this illustrative example, maintenance system 2104 includes maintenance equipment 2112. Maintenance equipment 2112 can include any equipment needed to perform maintenance on aircraft 2000 in FIG. 20. Maintenance equipment 2112 may include tools for performing different operations on parts on aircraft 2000 in FIG. 20. These operations can include at least one of disassembling parts, refurbishing parts, inspecting parts, reworking parts, manufacturing replacement parts, or other operations for performing maintenance on aircraft 2000 in FIG. 20. These operations can be for routine maintenance, inspections, upgrades, refurbishment, or other types of maintenance operations.

In the illustrative example, maintenance equipment 2112 may include ultrasonic inspection devices, x-ray imaging systems, vision systems, drills, crawlers, and other suitable devices. In some cases, maintenance equipment 2112 can include fabrication equipment 2108, assembly equipment 2110, or both to produce and assemble parts that needed for maintenance.

Product management system 2100 also includes control system 2114. Control system 2114 is a hardware system and may also include software or other types of components. Control system 2114 is configured to control the operation of at least one of manufacturing system 2102 or maintenance system 2104. In particular, control system 2114 can control the operation of at least one of fabrication equipment 2108, assembly equipment 2110, or maintenance equipment 2112.

The hardware in control system 2114 can be implemented using hardware that may include computers, circuits, networks, and other types of equipment. The control may take the form of direct control of manufacturing equipment 2106. For example, robots, computer-controlled machines, and other equipment can be controlled by control system 2114. In other illustrative examples, control system 2114 can manage operations performed by human operators 2116 in manufacturing or performing maintenance on aircraft 2000. For example, control system 2114 can assign tasks, provide instructions, display models, or perform other operations to manage operations performed by human operators 2116.

In these illustrative examples, product manager 110 in FIG. 1 and FIG. 2 can be implemented in control system 2114 or in communication with control system 2114 to manage at least one of the manufacturing or maintenance of aircraft 2000 in FIG. 20. For example, the models managed by product manager 110 can be used to form actions based on the maturity states determined for the models. For example, the maturity states for the models can be used by product manager 110 to determine actions to be performed based on gates closed in a model maturity alignment plan that specifies different phases in the development of a product. Based on the at least one of maturity states or gates closed in the model maturity alignment plan, control system 2114 can generate instructions, commands, work orders, and other information for use in performing manufacturing or maintenance of a product. For example, a closing a gate can mean that components can be manufactured or assembled.

In the different illustrative examples, human operators 2116 can operate or interact with at least one of manufacturing equipment 2106, maintenance equipment 2112, or control system 2114. This interaction can occur to manufacture aircraft 2000 in FIG. 20.

Of course, product management system 2100 may be configured to manage other products other than aircraft 2000 in FIG. 20. Although product management system 2100 has been described with respect to manufacturing in the aerospace industry, product management system 2100 can be configured to manage products for other industries. For example, product management system 2100 can be configured to manufacture products for the automotive industry as well as any other suitable industries.

Thus, one or more of the illustrative examples provide a method, apparatus, system, and computer program product for evaluating a maturity of a model for a product. A selected maturity state is determined by a computer system for the model for evaluation. A determination is made by the computer system as to whether the model meets a set of criteria for the selected maturity state and a confidence level for the selected maturity state. A model action is performed by the computer system using the model when the model meets the set of criteria for the selected maturity state and the confidence level for the selected maturity state.

In the illustrative examples, maturity states and confidence levels for the maturity states can be selected in a manner that is unique for at least one of a particular customer, product, industry, business, or some other factor. The illustrative examples also can employ a gated process for product development using a model maturity alignment plan. With this plan, models can be identified as meeting criteria for particular phases of product development can be identified based on the maturity states for models for the product. Closing gates based on at least one of the maturity states of the models or other gated process criteria can enable performing product actions with a desired level of confidence that the models will provide the information needed for that phase of product development.

One or more features of the illustrative examples are described in the following clauses. These clauses are examples of features not intended to limit other illustrative examples.

Clause 1.

A method for evaluating a maturity of a model for a product, the method comprising:
 determining, by a computer system, a selected maturity state for the model for evaluation;
 determining, by the computer system, whether the model meets a set of criteria for the selected maturity state and a confidence level for the selected maturity state; and
 performing, by the computer system, a model action using the model when the model meets the set of criteria for the selected maturity state and the confidence level for the selected maturity state.

Clause 2.

The method of clause 1, wherein determining, by the computer system, whether the model meets the set of criteria for the selected maturity state and the confidence level for the selected maturity state comprises:
 determining, by the computer system, a model type for the model;
 determining, by the computer system, the set of criteria for the selected maturity state and the confidence level for the selected maturity state for the model from criteria for maturity states and confidence levels for the maturity states based on the model type for the model and the selected maturity state; and
 determining, by the computer system, whether the model meets the set of criteria and the confidence level for the selected maturity state determined using the model type and the selected maturity state for the model.

Clause 3.

The method of clause 2, wherein the set of criteria and the confidence level for the selected maturity state is determined from a collection of criteria for the maturity states for models and the confidence levels for the maturity states.

Clause 4.

The method of clause 3, wherein the collection of criteria for the maturity states and confidence levels for the maturity states for the models is in a data structure selected from at least one of a model maturity matrix, a spreadsheet, a database, or a table.

Clause 5.

The method of clause 1, 2, 3, or 4 further comprising:
 identifying, by the computer system, a model maturity alignment plan that specifies threshold maturity states for models for gates in a gated process for the product in which a gate in the gates indicates a phase in a product development of the product; and
 determining, by the computer system, a set of gates in the gated process for the product for which maturity states for the models meet gated process criteria for the set of gates when the maturity states determined for the models meet the threshold maturity states for the set of gates.

Clause 6.

The method of clause 5 further comprising:
 performing a set of product actions for the product based on the set of gates determined to be met for the product.

Clause 7.

The method of clause 1, 2, 3, 4, 5, or 6 further comprising:
 requesting input for a set of questions related to the set of criteria for the selected maturity state, wherein the input is used to identify artifacts for comparing the model to the set of criteria.

Clause 8.

The method of clause 1, 2, 3, 4, 5, 6, or 7 further comprising:
 identifying, by the computer system, the product;
 identifying, by the computer system, maturity states for model types;
 identifying, by the computer system, the model types for the product;
 identifying, by the computer system, criteria and confidence levels for the maturity states for the model types; and
 generating, by the computer system, a collection of the criteria and the confidence levels for the maturity states for the model types.

Clause 9.

The method of clause 1, 2, 3, 4, 5, 6, 7, or 8 further comprising:
 generating, by the computer system, a model maturity alignment plan that specifies threshold maturity states for gates in a gated process for the product in which a gate in the gates indicates a phase in a product development of the product is completed when maturity states for models for the product meet the threshold maturity states for the gate and other gated process criteria for the gate.

Clause 10.

The method of clause 3, wherein the maturity states comprise at least one of a concept definition, an architectural definition, a solution definition, or a final definition.

Clause 11.

The method of clause 1, 2, 3, 4, 5, 6, 7, 8, 9, or 10, wherein the set of criteria specifies at least one of content, integration with another model for the product, a logical element, a schematic definition, a logical diagram, a geometry for a physical component, a link to another model, a description of features, an identification of parts, an application process, or a material.

Clause 12.

The method of clause 8, wherein the model types comprise at least one of a requirements model, a physical model, and a simulation model.

Clause 13.

The method of clause 1, 2, 3, 4, 5, 6, 7, 8, 9, 10, 11, or 12, wherein the product is selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, a maintenance system, and a product service.

Clause 14.

A method for evaluating a maturity of a model for a product, the method comprising:
  determining, by a computer system, potential maturity states for the model based on criteria for maturity states and confidence levels for the maturity states;
  determining, by the computer system, a highest potential maturity state in the potential maturity states in which the model meets a set of criteria for the highest potential maturity state and a model confidence level for the model that meets a confidence level for the highest potential maturity state, wherein the highest potential maturity state is a maturity state for the model; and
  performing, by the computer system, a model action for the product using the model based on the maturity state determined for the model.

Clause 15.

The method of clause 14, wherein determining, by the computer system, the highest potential maturity state in the potential maturity states in which the model meets the set of criteria for the highest potential maturity state and the model confidence level for the model that meets the confidence level for the highest potential maturity state, wherein the highest potential maturity state is the maturity state for the model comprises:
  determining, by the computer system, a model type for the model;
  determining, by the computer system, the criteria for the maturity states based on the model type for the model;
  determining, by the computer system, the confidence levels for the maturity states;
  determining, by the computer system, each maturity state in the maturity states in which the model meets the set of criteria and the confidence level for each maturity state to form the potential maturity states; and
  determining, by the computer system, the highest potential maturity state from the potential maturity states determined for the model to form the maturity state for the model.

Clause 16.

The method of clause 14 or 15, wherein the criteria for the maturity states and the confidence levels for the maturity states is determined from a collection of criteria for the maturity states and confidence levels for the maturity states for models.

Clause 17.

The method of clause 16, wherein the collection of criteria for the maturity states and the confidence levels for the maturity states for the models is in a data structure selected from at least one of a model maturity matrix, a spreadsheet, a database, or a table.

Clause 18.

The method of clause 14, 15, 16, or 17 further comprising:
  identifying, by the computer system, a model maturity alignment plan that specifies threshold maturity states for models for gates in a gated process for the product in which a gate in the gates indicates a phase in a product development of the product; and
  determining, by the computer system, a set of gates in the gated process for the product for which maturity states for the models meet gated process criteria for the set of gates when the maturity states determined for the models meet the threshold maturity states for the set of gates.

Clause 19.

The method of clause 18 further comprising:
  performing, by the computer system, a set of product actions for the product based on the set of gates determined to be closed in the gated process for the product.

Clause 20.

A method for evaluating a maturity of models for a product, the method comprising:
  identifying, by a computer system, the models for the product for evaluation;
  determining, by the computer system, highest potential maturity states for the models using criteria and confidence levels, wherein the highest potential maturity states for the models are maturity states for models; and
  performing, by the computer system, a model action based on the maturity states for the models determined for the models.

Clause 21.

The method of clause 20, wherein performing the model action based on the maturity states for the models determined for the models comprises:
  identifying, by the computer system, a model maturity alignment plan that specifies threshold maturity states for models for closing gates in a gated process for the product in which a gate in the gates indicates a phase in a product development of the product; and
  determining, by the computer system, a set of gates in the gated process for the product for which maturity states for the models meet gated process criteria for the set of gates when the maturity states determined for the models meet the threshold maturity state for the set of gates.

Clause 22.

A product management system comprising:
  a computer system; and
  a product manager in the computer system, wherein the product manager is configured to:
    determine a selected maturity state for a model for evaluation;
    determine whether the model meets a set of criteria for the selected maturity state and a confidence level for the selected maturity state; and
    perform a model action for the product using the model when the model meets the set of criteria and the confidence level.

Clause 23.

The product management system of clause 22, wherein in determining whether the model meets the set of criteria for the selected maturity state and the confidence level for the selected maturity state, the product manager is configured to:
  determine a model type for the model;
  determine the set of criteria for the selected maturity state and the confidence level for the selected maturity state for the model from criteria for maturity states and confidence levels for the maturity states on the model type for the model and the selected maturity state; and
  determine whether the model meets the set of criteria and the confidence level for the selected maturity state determined using the model type and the selected maturity state for the model.

Clause 24.

The product management system of clause 22, wherein the set of criteria and the confidence level for the selected maturity state is determined from a collection of criteria for the maturity states and confidence levels for the maturity states for models for the product.

Clause 25.

The product management system of clause 24, wherein the collection of criteria for the maturity states and the confidence levels for the maturity states for the models is in a data structure selected from at least one of a model maturity matrix, a spreadsheet, a database, or a table.

Clause 26.

The product management system of clause 22, 23, 24, or 25, wherein the product manager is configured to:
  identify a model maturity alignment plan that specifies threshold maturity states for models needed for gates in a gated process for the product in which a gate in the gates indicates a phase in a product development of the product; and
  determine a set of gates in a gated process for the product for which maturity states for the models meet gated process criteria for the set of gates when on maturity states determined for the models meet the threshold maturity states for the set of gates.

Clause 27.

The product management system of clause 26 the product manager is configured to:
  perform a set of product actions for the product based on the set of gates determined to be closed in the gated process for the product.

Clause 28.

The product management system of clause 22 the product manager is configured to:
  request user input for a set of questions related to the set of criteria for the selected maturity state, wherein the input is used in comparing the model to the set of criteria.

Clause 29.

The product management system of clause 22, 23, 24, 25, 26, 27, or 28, wherein the product manager is configured to:
  identify the product;
  identify model types for the product;
  identify maturity states;
  identify the criteria and confidence levels for the maturity states for the model types; and
  generate a collection of the criteria and the confidence levels for the maturity states for the model types.

Clause 30.

The product management system of clause 22, 23, 24, 25, 26, 27, 28, or 29, wherein the product manager is configured to:
  generate a model maturity alignment plan that specifies threshold maturity states for gates in the model maturity alignment plan for the product in which a gate in the gates indicates a phase in a product development of the product that is completed when the maturity states for models for the product meet the threshold maturity states for the gate and other gated process criteria for the gate.

Clause 31.

The product management system of clause 24, wherein the maturity states comprise at least one of a concept definition, an architectural definition, a solution definition, or a final definition.

Clause 32.

The product management system of clause 22, 23, 24, 25, 26, 27, 28, 29, 30, or 31, wherein the set of criteria specifies at least one of content, integration with another model for the product, a logical element, a schematic definition, a logical diagram, a geometry for a physical component, a link to another model, a description of features, an identification of parts, an application process, or a material.

Clause 33.

The product management system of clause 29, wherein the model types comprise at least one a requirements model, a physical model, and a simulation model.

Clause 34.

The product management system of clause 22, 23, 24, 25, 26, 27, 28, 29, 30, 31, 32, Or 33, wherein the model is for a product selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, and a maintenance system.

Clause 35.

A product management system comprising:
  a computer system; and
  a product manager in the computer system, wherein the product manager is configured to:
    determine potential maturity states for a model for a product based on criteria for maturity states and confidence levels for the maturity states;
    determine a highest potential maturity state in the potential maturity states in which the model meets a set of criteria for the highest potential maturity state and a model confidence level for the model that meets a confidence level for the highest potential maturity state, wherein the highest potential maturity state is a maturity state for the model; and
    perform a model action for the product using the model based on the maturity state determined for the model.

Clause 36.

The product management system of clause 35, wherein in determining the highest potential maturity state in the potential maturity states in which the model meets the set of criteria for the highest potential maturity state and the model confidence level for the model the meets the confidence level for the highest potential maturity state, wherein the highest potential maturity state is the maturity state for the model, wherein the product manager is configured to:
  determine a model type for the model;
  determine the criteria for the maturity states based on the model type for the model;
  determine the confidence levels for the maturity states for the model;
  determine each maturity state in the maturity states in which the model meets the set of criteria and the confidence level for each maturity state to form the potential maturity states; and
  determine the highest potential maturity state from the potential maturity states determined for the model to form the maturity state for the model.

Clause 37.

The product management system of clause 35 or 36, wherein the criteria for the maturity states and the confidence levels for the maturity states is determined from a collection of the criteria for maturity states and the confidence levels for the maturity states for models.

Clause 38.

The product management system of clause 37, wherein the collection of the criteria for the maturity states and the confidence levels for the maturity states for the models is in a data structure selected from at least one of a model maturity matrix, a spreadsheet, a database, or a table.

Clause 39.

The product management system of clause 35, 36, 37, or 38, wherein the product manager is configured to:
identify a model maturity alignment plan that specifies threshold maturity states for models needed for gates in a gated process for the product in which a gate in the gates indicates a phase in a product development of the product; and
determine a set of gates in a gated process for the product for which maturity states for the models meet gated process criteria for the set of gates when on maturity states determined for the models meet the threshold maturity states for the set of gates.

Clause 40.

The product management system of clause 39, wherein the product manager is configured to:
perform a set of product actions for the product based on the set of gates determined to be closed in the gated process for the product.

Clause 41.

A product management system comprising:
a computer system; and
a product manager in the computer system, wherein the product manager is configured to:
identify models for a product for evaluation;
determine highest potential maturity states for the models using criteria and confidence levels for the criteria, wherein the highest potential maturity states for the models are maturity states for models; and
perform a model action based on the maturity states for models determined for the models.

Clause 42.

The product management system of clause 41, wherein in performing an action for the product based on the maturity states for the models determined for the models, the product manager is configured to:
identify a model maturity alignment plan that specifies threshold maturity states for models needed for gates in a gated process for the product in which a gate in the gates indicates a phase in a product development of the product; and
determine a set of gates in a gated process for the product for which maturity states for the models meet gated process criteria for the set of gates when on maturity states determined for the models meet the threshold maturity states for the set of gates.

Clause 43.

The product management system of clause 41 or 42, wherein the product manager is configured to:
identify the product;
identify model types for the product;
identify maturity states;
identify the criteria and confidence levels for the maturity states for the model types; and
generate a collection of the criteria and the confidence levels for the maturity states for the model types.

Clause 44.

The product management system of clause 41, 42, or 43, wherein the product manager is configured to:
generate a model maturity alignment plan that specifies threshold maturity states for gates in the model maturity alignment plan for the product in which a gate in the gates indicates a phase in a product development of the product that is completed when the maturity states for models for the product meet the threshold maturity states for the gate and other gated process criteria for the gate.

Clause 45.

The product management system of clause 41, 42, 43, or 44, wherein the maturity states comprise at least one of a concept definition, an architectural definition, a solution definition, or a final definition.

Clause 46.

The product management system of clause 41, 42, 43, 44, or 45, wherein the set of criteria specifies at least one of content, integration with another model for the product, a logical element, a schematic definition, a logical diagram, a geometry for a physical component, a link to another model, a description of features, an identification of parts, an application process, or a material.

Clause 47.

The product management system of clause 43, wherein the model types comprise at least one a requirements model, a physical model, and a simulation model.

Clause 48.

The product management system of clause 41, 42, 43, 44, 45, 46, or 47, wherein the model is for a product selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, and a maintenance system.

Clause 49.

A product management system comprising:
a manufacturing system;
a control system; and
a product manager in the control system, wherein the product manager is configured to:
determine a selected maturity state for a model for evaluation;
determine whether the model meets a set of criteria for the selected maturity state and a confidence level for the selected maturity state; and
control a model action performed for the product using the model when the model meets the set of criteria and the confidence level.

Clause 50.

The product management system of clause 49, wherein in controlling the model action performed for the product using the model when the model meets the set of criteria and the confidence level comprises:
controlling the manufacturing system to perform the model action performed for the product using the model when the model meets the set of criteria and the confidence level.

Clause 51.

The product management system of clause 49 or 50, wherein in controlling the model action performed for the product using the model when the model meets the set of criteria and the confidence level comprises:
controlling a maintenance system to perform the model action performed for the product using the model when the model meets the set of criteria and the confidence level.

Clause 52.

The product management system of clause 49, 50, or 51, wherein in determining whether the model meets the set of criteria for the selected maturity state and the confidence level for the selected maturity state, the product manager is configured to:
  determine a model type for the model;
  determine the set of criteria for the selected maturity state and the confidence level for the selected maturity state for the model from criteria for maturity states and confidence levels for the maturity states on the model type for the model and the selected maturity state; and
  determine whether the model meets the set of criteria and the confidence level for the selected maturity state determined using the model type and the selected maturity state for the model.

Clause 53.

The product management system of clause 49, 50, 51, or 52, wherein the set of criteria and the confidence level for the selected maturity state is determined from a collection of criteria for the maturity states and confidence levels for the maturity states for models for the product.

Clause 54.

The product management system of clause 53, wherein the collection of criteria for the maturity states and the confidence levels for the maturity states for the models is in a data structure selected from at least one of a model maturity matrix, a spreadsheet, a database, or a table.

Clause 55.

The product management system of clause 49, 50, 51, 52, 53, 53, or 54, wherein the product manager is configured to:
  identify a model maturity alignment plan that specifies threshold maturity states for models needed for gates in a gated process for the product in which a gate in the gates indicates a phase in a product development of the product; and
  determine a set of gates in a gated process for the product for which maturity states for the models meet gated process criteria for the set of gates when on maturity states determined for the models meet the threshold maturity states for the set of gates.

Clause 56.

The product management system of clause 55, wherein the product manager is configured to:
  perform a set of product actions for the product based on the set of gates determined to be closed in the gated process for the product.

Clause 57.

The product management system of clause 49, 50, 51, 52, 53, 54, 55, or 56, wherein the product manager is configured to:
  request user input for a set of questions related to the set of criteria for the selected maturity state, wherein the input is used in comparing the model to the set of criteria.

Clause 58.

The product management system of clause 49, 50, 51, 52, 53, 54, 55, 56, or 57, wherein the product manager is configured to:
  identify the product;
  identify model types for the product;
  identify maturity states;
  identify the criteria and confidence levels for the maturity states for the model types; and
  generate a collection of the criteria and the confidence levels for the maturity states for the model types.

Clause 59.

The product management system of clause 49, 50, 51, 52, 53, 54, 55, 56, 57, or 58, wherein the product manager is configured to:
  generate a model maturity alignment plan that specifies threshold maturity states for gates in the model maturity alignment plan for the product in which a gate in the gates indicates a phase in a product development of the product that is completed when the maturity states for models for the product meet the threshold maturity states for the gate and other gated process criteria for the gate.

Clause 60.

The product management system of clause 48, wherein the maturity states comprise at least one of a concept definition, an architectural definition, a solution definition, or a final definition.

Clause 61.

The product management system of clause 49, 50, 51, 52, 53, 54, 55, 56, 57, 58, 59, or 60, wherein the set of criteria specifies at least one of content, integration with another model for the product, a logical element, a schematic definition, a logical diagram, a geometry for a physical component, a link to another model, a description of features, an identification of parts, an application process, or a material.

Clause 62.

The product management system of clause 58, wherein the model types comprise at least one a requirements model, a physical model, and a simulation model.

Clause 63.

The product management system of clause 49, 50, 51, 52, 53, 54, 55, 56, 57, 58, 59, 60, 61, Or 62, wherein the model is for a product selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, and a maintenance system.

Clause 64.

A computer program product for determining a maturity state of a model, the computer program product comprising:
  a computer-readable storage media; and
  a data structure, stored on the computer-readable storage media, comprising maturity states, criteria for the maturity states in which the criteria identifies model elements and criteria for the model elements needed for each maturity state in the maturity states, and confidence levels for the maturity states in which a confidence level for a maturity state is a level of confidence that the model can meet the criteria for the maturity state.

Clause 65.

The computer program product of clause 64 further comprising:
  first program code, stored on the computer-readable storage media, for determining whether the model meets a set of criteria for a selected maturity state and the confidence level for the selected maturity state using the data structure; and
  second program code, stored on the computer-readable storage media, for performing a model action for the product using the model when the model meets the set of criteria for the selected maturity state and the confidence level for the selected maturity state.

Clause 66.

The computer program product of clause 64 or 66, wherein the data structure is one of a model maturity matrix, a spreadsheet, a database, or a table.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for running an operational simulation for a product, the method comprising:
   determining, by a computer system, a selected maturity state for a model comprising a dynamic representation of a performance of the product in an operational environment of the product for evaluation;
   determining, by the computer system, whether the model meets:
      a set of criteria for content in the model for a phase in a lifecycle of the product for the selected maturity state; and
      a confidence level of a prediction made using the model for the selected maturity state;
   determining a risk of performing the operational simulation in a phase of a production of the product responsive to a determination that the model has not fully met a maturity level required for a gate for the phase of production; and
   performing the operational simulation for the product, via the computer system using the model responsive to the model meeting the set of criteria for the content in the model for the phase in the lifecycle of the product for the selected maturity state and the confidence level of the prediction made using the model for the selected maturity state.

2. The method of claim 1, further comprising:
   determining, by the computer system, a model type for the model;
   determining, by the computer system, the set of criteria for the content in the model for the product for the selected maturity state and the confidence level for the selected maturity state for the model from criteria for maturity states and confidence levels for the maturity states based on the model type for the model and the selected maturity state; and
   determining, by the computer system, whether the model meets the set of criteria and the confidence level for the selected maturity state determined using the model type and the selected maturity state for the model.

3. The method of claim 2, wherein the set of criteria and the confidence level for the selected maturity state is determined from a collection of criteria for the maturity states for models and the confidence levels for the maturity states.

4. The method of claim 3, wherein the collection of criteria for the maturity states and the confidence levels for the maturity states for the models is in a data structure selected from at least one of: a model maturity matrix, a spreadsheet, or a table.

5. The method of claim 1, further comprising:
   the phase in the lifecycle of the product being at least one of: design, manufacturing, testing, verification, certification, maintenance, or retirement;
   identifying, by the computer system, a model maturity alignment plan that specifies threshold maturity states for models for gates in a gated process for the product in which a gate in the gates indicates a phase in a product development of the product; and
   determining, by the computer system, a set of gates in the gated process for the product for which maturity states for the model for gates in the gated process meet gated process criteria for the set of gates when the maturity states determined for the model for gates in the gated process meet the threshold maturity states for the set of gates.

6. The method of claim 5, further comprising:
   the model being a simulation model; and
   performing a set of product actions for the product based on the set of gates determined to be met for the product.

7. The method of claim 1, further comprising:
   requesting input for a set of questions related to the set of criteria for the selected maturity state, wherein the input is used to identify artifacts for comparing the model to the set of criteria.

8. The method of claim 1, further comprising:
   identifying, by the computer system, the product;
   identifying, by the computer system, maturity states for model types;
   identifying, by the computer system, the model types for the product;
   identifying, by the computer system, criteria and confidence levels for the maturity states for the model types; and
   generating, by the computer system, a collection of the criteria and the confidence levels for the maturity states for the model types.

9. The method of claim 1, further comprising:
   generating, by the computer system, a model maturity alignment plan that specifies threshold maturity states for gates in a gated process for the product in which a gate in the gates indicates a phase in a product development of the product is completed when maturity states for models for the product meet the threshold maturity states for the gate and other gated process criteria for the gate.

10. The method of claim 3, wherein the maturity states comprise at least one of a concept definition, an architectural definition, a solution definition, or a final definition.

11. The method of claim 1, wherein the set of criteria specifies at least one of content, integration with another model for the product, a logical element, a schematic definition, a logical diagram, a geometry for a physical component, a link to another model, a description of features, an identification of parts, an application process, or a material.

12. The method of claim 8, wherein the model types comprise a simulation model.

13. The method of claim 1, wherein the product is selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, a maintenance system, and a product service.

14. A method of identifying new capabilities for a product, the method comprising:
determining, by a computer system, potential maturity states for model a model comprising a dynamic representation of a performance of the product in an operational environment of the product using criteria content in the model for a phase in a lifecycle of the product for maturity states and confidence levels of predictions made using the model for the maturity states;
determining, by the computer system, a highest potential maturity state in the potential maturity states in which the model meets a set of criteria for content in the model for the product for the highest potential maturity state and a model confidence level for the model that meets a confidence level for the highest potential maturity state, wherein the highest potential maturity state is a maturity state for the model;
determining a risk of performing an action in a phase of a production of the product responsive to a determination that the model has not fully met a maturity level required for a gate for the phase of production; and
identifying the new capabilities for the product via the computer system using the model responsive to the model meeting the set of criteria for the content in the model for the phase in the lifecycle of the product for the highest potential maturity state and the confidence level of the prediction made using the model for the highest potential maturity state.

15. The method of claim 14, further comprising:
determining, by the computer system, a model type for the model;
determining, by the computer system, the set of criteria for the maturity states based on the model type for the model;
determining, by the computer system, the confidence levels for the maturity states;
determining, by the computer system, each maturity state in the maturity states in which the model meets the set of criteria and a confidence level of a prediction made using the model respectively for each maturity state to form the potential maturity states; and
determining, by the computer system, the highest potential maturity state from the potential maturity states determined for the model to form the maturity state for the model.

16. The method of claim 14, wherein the criteria for the maturity states and the confidence levels for the maturity states is determined from a collection of criteria for the maturity states and confidence levels for the maturity states for models.

17. The method of claim 16, wherein the collection of criteria for the maturity states and the confidence levels for the maturity states for the models is in a data structure selected from at least one of a model maturity matrix, a spreadsheet, or a table.

18. The method of claim 14 further comprising:
the model being an operational simulation model;
identifying, by the computer system, a model maturity alignment plan that specifies threshold maturity states for models for gates in a gated process for the product in which a gate in the gates indicates a phase in a product development of the product; and
determining, by the computer system, a set of gates in the gated process for the product for which maturity states for the model meet gated process criteria for the set of gates when the maturity states determined for the model meet the threshold maturity states for the set of gates.

19. The method of claim 18 further comprising:
performing, by the computer system, a set of product actions for the product based on the set of gates determined to be closed in the gated process for the product.

20. A method for using models for performing an operational simulation comprising a dynamic representation of a performance of a product in an operational environment of the product, the method comprising:
identifying, by a computer system, the models for the product for evaluation;
determining, by the computer system, highest potential maturity states for the models using a set of criteria for content in the models for a phase in a lifecycle of the product and confidence levels of predictions made using the models, wherein the highest potential maturity states for the models are maturity states for models; and
performing the operational simulation via the computer system using the model responsive to the maturity states for the models determined for the models and the confidence levels of the predictions made using the maturity states for the models determined for the models.

21. The method of claim 20, further comprising:
identifying, by the computer system, a model maturity alignment plan that specifies threshold maturity states for models for closing gates in a gated process for the product in which a gate in the gates indicates a phase in a product development of the product, wherein the set of criteria for the content in the model for the product progressively includes more: systems in the product, subsystems in the product, and components in product, as a maturity state increases; and
determining, by the computer system, a set of gates in the gated process for the product for which maturity states for the models meet gated process criteria for the set of gates when the maturity states determined for the models meet the threshold maturity state for the set of gates.

22. A product management system that comprises:
a computer system; and
a product manager in the computer system, wherein the product manager is configured to:
determine a selected maturity state for a model for a product for evaluation;
determine whether the model meets a set of criteria for content in the model for a phase in a lifecycle of the product for the product for the selected maturity state and a confidence level of a prediction made based upon the model for the selected maturity state;

determine a risk of a performance an action in a phase of a production of the product responsive to a determination that the model has not fully met a maturity level required for a gate for the phase of production; and perform, using the model when the model meets the set of criteria for the content in the model for the phase in the lifecycle of the product for the selected maturity state and the confidence level of the prediction made based upon the model for the selected maturity state, an operational simulation comprising a dynamic representation of a performance of the product in an operational environment of the product.

23. The product management system of claim 22, wherein the product manager is further configured to:
determine a model type for the model;
determine the set of criteria for the selected maturity state and the confidence level for the selected maturity state for the model from criteria for maturity states and confidence levels for maturity states on the model type for the model and the selected maturity state; and
determine whether the model meets the set of criteria and the confidence level for the selected maturity state determined using the model type and the selected maturity state for the model.

24. The product management system of claim 22, wherein the set of criteria for the content in the model for the product and the confidence level for the selected maturity state is determined from a collection of criteria for maturity states and confidence levels for maturity states for models for the product, wherein the set of criteria for the content in the model for the product progressively includes more: systems in the product, subsystems in the product, and components in product, as a maturity state increases.

25. The product management system of claim 24, wherein the collection of criteria for the maturity states and the confidence levels for the maturity states for the models is in a data structure selected from at least one of a model maturity matrix, a spreadsheet, or a table.

26. The product management system of claim 22, wherein the product manager is further configured to:
identify a model maturity alignment plan that specifies threshold maturity states for models needed for gates in a gated process for the product in which a gate in the gates indicates a phase in a product development of the product; and
determine a set of gates in a gated process for the product for which maturity states for the models meet gated process criteria for the set of gates when the maturity states determined for the models meet the threshold maturity states for the set of gates.

27. The product management system of claim 26, wherein the product manager is further configured to perform a set of product actions for the product based on the set of gates determined to be closed in the gated process for the product.

28. The product management system of claim 22, wherein the product manager is further configured to:
request an input for a set of questions related to the set of criteria for the selected maturity state, wherein the input is used in comparing the model to the set of criteria.

29. The product management system of claim 22, wherein the product manager is further configured to:
identify the product;
identify model types for the product;
identify maturity states;
identify the criteria for content in the model types for a phase in a lifecycle of the product and confidence levels of predictions made using the model for the maturity states for the model types; and
generate a collection of the criteria and the confidence levels for the maturity states for the model types.

30. The product management system of claim 22, wherein the product manager is further configured to generate a model maturity alignment plan that specifies threshold maturity states for gates in the model maturity alignment plan for the product in which a gate in the gates indicates a phase in a product development of the product that is completed when maturity states for models for the product meet the threshold maturity states for the gate and other gated process criteria for the gate.

31. The product management system of claim 24, wherein the maturity states comprise at least one of a concept definition, an architectural definition, a solution definition, or a final definition.

32. The product management system of claim 22, wherein the set of criteria specifies at least one of content, integration with another model for the product, a logical element, a schematic definition, a logical diagram, a geometry for a physical component, a link to another model, a description of features, an identification of parts, an application process, or a material.

33. The product management system of claim 29, wherein the model types comprise a simulation model.

34. The product management system of claim 22, wherein the model is for a product selected from one of a mobile platform, a stationary platform, a land-based structure, an aquatic-based structure, a space-based structure, an aircraft, a passenger airplane, a rotorcraft, a spacecraft, a satellite, a surface ship, a tank, a personnel carrier, a train, a space station, a submarine, an automobile, a power plant, a bridge, a dam, a house, a manufacturing facility, a building, an engine, a cooling system, a computer, a computer network, a robotic arm, a manufacturing tool, a press, a manufacturing system, and a maintenance system.

35. A product management system that comprises:
a computer system; and
a product manager in the computer system, wherein the product manager is configured to:
determine potential maturity states for a model for a product based on criteria for content in the model for a phase in a lifecycle of the product for maturity states and confidence levels of a prediction made based on the model for the maturity states;
determine a highest potential maturity state in the potential maturity states in which the model meets a set of criteria for the highest potential maturity state and a model confidence level for the model that meets a confidence level for the highest potential maturity state, wherein the highest potential maturity state is a maturity state for the model;
determine a risk of a performance of an action in a phase of a production of the product responsive to a determination that the model has not fully met a maturity level required for a gate for the phase of production; and
perform an operational simulation based on the model based on the maturity state determined for the model and the confidence level of the prediction made based on the model for the maturity state, wherein the operational simulation comprises comprising a dynamic representation of a performance of the product in an operational environment of the product.

36. The product management system of claim 35, wherein the product manager is further configured to:
    determine a model type for the model;
    determine the criteria for the content in the model for the product for the maturity states based on the model type for the model;
    determine the confidence levels for the maturity states for the model, wherein the set of criteria for the content in the model for the product progressively includes more: systems in the product, subsystems in the product, and components in product, as a maturity state increases;
    determine each maturity state in the maturity states in which the model meets the set of criteria and a confidence level respectively for each maturity state to form the potential maturity states; and
    determine the highest potential maturity state from the potential maturity states determined for the model to form the maturity state for the model.

37. The product management system of claim 35, wherein the criteria for the maturity states and the confidence levels for the maturity states is determined from a collection of the criteria for maturity states and the confidence levels for the maturity states for models.

38. The product management system of claim 37, wherein the collection of the criteria for the maturity states and the confidence levels for the maturity states for the models is in a data structure selected from at least one of a model maturity matrix, a spreadsheet, or a table.

39. The product management system of claim 35, wherein the product manager is further configured to:
    identify a model maturity alignment plan that specifies threshold maturity states for models needed for gates in a gated process for the product in which a gate in the gates indicates a phase in a product development of the product; and
    determine a set of gates in the gated process for the product for which maturity states for the models meet gated process criteria for the set of gates when on maturity states determined for the models meet the threshold maturity states for the set of gates.

40. The product management system of claim 39, wherein the product manager is further configured to:
    perform a set of product actions for the product based on the set of gates determined to be closed in the gated process for the product.

41. A product management system that comprises:
    a computer system; and
    a product manager in the computer system, wherein the product manager is configured to:
      identify models for a product for evaluation;
      determine highest potential maturity states for the models based on a criteria for content in the models for a phase in a lifecycle of a product and confidence levels for predictions made based upon the models for the criteria, wherein the highest potential maturity states for the models are maturity states for models;
      determine a risk of a performance of an action in a phase of a production of the product responsive to a determination that the model has not fully met a maturity level required for a gate for the phase of production; and
      perform an operational simulation based on the maturity states for models determined for the models and the confidence level of the predictions made using the models for the highest potential maturity states, wherein the operational simulation comprises comprising a dynamic representation of a performance of the product in an operational environment of the product.

42. The product management system of claim 41, wherein the product manager is further configured to:
    identify a model maturity alignment plan that specifies threshold maturity states for models needed for gates in a gated process for the product in which a gate in the gates indicates a phase in a product development of the product; and
    determine a set of gates in a gated process for the product for which maturity states for the models meet gated process criteria for the set of gates when on maturity states determined for the models meet the threshold maturity states for the set of gates, wherein the set of criteria for the content in the model for the product progressively includes more: systems in the product, subsystems in the product, and components in product, as a maturity state increases.

43. A product management system that comprises:
    a manufacturing system;
    a control system; and
    a product manager in the control system, wherein the product manager is configured to:
      determine a selected maturity state for a model for a product for evaluation;
      determine whether the model meets a set of criteria for a content in the model for a phase in a lifecycle of the product for the product for the selected maturity state and a confidence level of a prediction made based upon the model for the selected maturity state;
      determine a risk of a performance of an action in a phase of a production of the product responsive to a determination that the model has not fully met a maturity level required for a gate for the phase of production; and
      control an operational simulation based on the model when the model meets the set of criteria for the content in the model for the product and the confidence level and the confidence level of the prediction made using the model for the selected maturity state, wherein the operational simulation comprises comprising a dynamic representation of a performance of the product in an operational environment of the product.

44. The product management system of claim 43, further comprising:
    a performance of at least one of: the operational simulation, manufacture of a prototype, or manufacture of a component, for the product being based upon the model when the model meets the set of criteria and the confidence level.

45. The product management system of claim 43, comprising the product manager further configured to control a maintenance system to perform at least one of: the operational simulation, manufacture of a prototype, or manufacture a component, for the product based upon the model when the model meets the set of criteria and the confidence level.

46. A computer program product configured to control a product management system based upon a maturity state of a model for a product, wherein the computer program product comprises:

a computer-readable storage media; and
a data structure, stored on the computer-readable storage media, that comprises:
  maturity states;
  criteria for a content in the model for a phase in a lifecycle of the product progressively includes more: systems in the product, subsystems in the product, and components in product, as a maturity state increases for the maturity states in which the criteria for the content in the model for the product identifies model elements and criteria for the model elements needed for each maturity state in the maturity states;
  confidence levels, of predictions made based upon the model, for the maturity states, wherein a confidence level for the maturity state assures that the model can meet the criteria for the maturity state; and
  specially programmed code configured to control an operational simulation based on the model when the model meets the criteria for the content in the model for the product and the confidence level and the confidence level of the prediction made using the model for the maturity state, wherein the operational simulation comprises a dynamic representation of a performance of the product in an operational environment of the product.

47. The computer program product of claim 46, further comprising:
  first program code, stored on the computer-readable storage media, configured to determine whether the model meets a set of criteria for a selected maturity state and a confidence level for the selected maturity state based on the data structure; and
  second program code, stored on the computer-readable storage media, for performing a model action for the product using the model when the model meets the set of criteria for the selected maturity state and the confidence level for the selected maturity state.

48. The computer program product of claim 46, wherein the data structure is one of a model maturity matrix, a spreadsheet, or a table.

\* \* \* \* \*